United States Patent
Mizutani

(10) Patent No.: US 7,147,987 B2
(45) Date of Patent: Dec. 12, 2006

(54) POSITIVE RESIST COMPOSITION AND PATTERN FORMATION METHOD USING THE SAME

(75) Inventor: Kazuyoshi Mizutani, Shizuoka (JP)

(73) Assignee: Fuji Photo Film Co. Ltd., Kanagawa (JP)

( * ) Notice: Subject to any disclaimer, the term of this patent is extended or adjusted under 35 U.S.C. 154(b) by 0 days.

(21) Appl. No.: 10/911,510

(22) Filed: Aug. 5, 2004

(65) Prior Publication Data

US 2005/0069808 A1   Mar. 31, 2005

(30) Foreign Application Priority Data

Aug. 5, 2003   (JP)   ............ P2003-286803

(51) Int. Cl.
*G03C 1/73* (2006.01)
*G03F 7/039* (2006.01)

(52) U.S. Cl. .............. 430/270.1; 430/326; 430/907

(58) Field of Classification Search ............ 430/270.1, 430/326, 907

See application file for complete search history.

(56) References Cited

U.S. PATENT DOCUMENTS

2005/0026074 A1 *  2/2005  Inabe et al. .............. 430/270.1

FOREIGN PATENT DOCUMENTS

| EP | 1 319 981 A2 | 6/2003 |
|----|---|---|
| JP | 2003-82030 A | 3/2003 |
| JP | 2003-89708 A | 3/2003 |
| WO | WO 00/67072 A1 | 11/2000 |

OTHER PUBLICATIONS

Takuya Hagiwara et al., "Characterization of Fluoropolymer Resist for 157 -nm Lithography" (2003), Journal of Photopolymer Science and Technology, vol. 16, No. 4, pp. 567-613.
Kyle Patterson et al., "Polymers for 157 nm Photoresist Applications: A Progress Report" (2000), Advances in Resist Technology and Processing XVII, vol. 3999, pp. 365-374.
Seiichi Ishikawa et al., "Performances of Resists for 157-nm Lithography Based on Monocyclic Fluoropolymers", (2003) vol., 5039, No. 1, pp. 580-588.
Iqbal Sharif et al., "Advances in TFE Based Fluoropolymers for 157nm Lithography: A Progress Report", (2003) vol. 5039, No. 1, pp. 33-42.
European Search Report dated Dec. 27, 2004.

* cited by examiner

*Primary Examiner*—Sin Lee
(74) *Attorney, Agent, or Firm*—Sughrue Mion, PLLC

(57) ABSTRACT

A positive resist composition comprising (A) a compound that generates an acid upon irradiation of an actinic ray or radiation and (B) a resin having a property of increasing solubility in an alkali developing solution by the action of an acid and including a repeating unit containing a partial structure represented by formula (X) defined in the specification and a repeating unit represented by formula (Y) defined in the specification.

11 Claims, No Drawings

POSITIVE RESIST COMPOSITION AND PATTERN FORMATION METHOD USING THE SAME

FIELD OF THE INVENTION

The present invention relates to a positive resist composition suitably used in microlithography processes, for example, in the production of VLSI or high capacity microchips, or in other photofabrication processes. More specifically, the invention relates to a positive resist composition capable of forming a highly precise pattern using a vacuum ultraviolet ray of not longer than 160 nm as a light source for exposure.

BACKGROUND OF THE INVENTION

The degree of integration of integrated circuits has recently become much higher, and the processing of ultra-fine patterns having a line width of a quarter micron or below is required in the production of semiconductor substrate, for example, VSLI. In order to form fine patterns, means of reducing a wavelength of exposure light source for use in the production of resist patterns is known.

For instance, in the production of semiconductor device having the degree of integration up to 64 Mbits, an i-line (365 nm) of high pressure mercury lamp has been employed as the light source. As a positive resist corresponding to the light source, a large number of compositions containing a novolak resin and a naphthoquinone diazide compound as a photosensitive substance have been developed. These compositions have achieved full success in the processing of linewidth up to about 0.3 µm. Also, in the production of semiconductor device having the degree of integration of 256 Mbits or more, a KrF excimer laser beam (248 nm) is employed as the light source in place of the i-line.

In recent years, for the purpose of the production of semiconductor device having the degree of integration of 1 Gbit or more, as a light source having shorter wavelength, the use of an ArF excimer laser beam (193 nm) and further, the use of an $F_2$ excimer laser beam (157 nm) in order to form a pattern of not more than 0.1 µm have been investigated.

In response to such a trend of using light source having a shorter wavelength, constituent components of the resist materials and structure of compounds used for the constituent components have been greatly changed.

As the resist composition for exposure using a KrF excimer laser beam, a composition in which a resin including a basic skeleton of poly (hydroxystyrene) that has a small absorption in the region of around 248 nm and being protected by an acid-decomposable group is used as the main component and a compound that generates an acid upon irradiation of a far ultraviolet ray (a photo-acid generator) is used in combination, that is, a so-called chemical amplification resist has been developed.

Further, as the resist composition for exposure using a ArF excimer laser beam (193 nm), a chemical amplification resist using a resin having an alicyclic structure, which do not have an absorption at 193 nm, introduced into the main chain or side chain has been developed.

It has been found in case of using an $F_2$ excimer laser beam (157 nm), however, that since the above-described alicyclic group-containing resin still has a large absorption in the region of around 157 nm, it is insufficient for obtaining the desired pattern of not more than 0.1 µm. In the circumstances, it has been known that a resin having a fluorine atom introduced therein has sufficient transparency at 157 nm. Structures of fluorine resins are proposed, for example, in Patent Document 1 (JP-A-2003-89708 (the term "JP-A" as used herein means an "unexamined published Japanese patent application")), Patent Document 2 (JP-A-2003-82030) and Non-Patent Document 1 (*Journal of Photopolymer Science and Technology*), Vol. 16.4, pages 607 to 614 (2003)), and resist compositions including a fluorine resin are investigated.

However, resist compositions including the fluorine resin have problems in surface roughness, development defect, development residue (scum), resolution or the like, and solution of these problems has been desired.

Patent Document 1: JP-A-2003-89708

Patent Document 2: JP-A-2003-82030

Non-Patent Document 1: *Journal of Photopolymer Science and Technology*), Vol. 16.4, pages 607 to 614 (2003)

SUMMARY OF THE INVENTION

Therefore, an object of the present invention is to provide a positive resist composition suitable for using an exposure light source having a wavelength of not more than 160 n-m, particularly an $F_2$ excimer laser beam (157 nm).

Another object of the invention is to provide a positive resist composition, which has sufficient transmission at the time using a light source having a wavelength of 157 nm and is improved in surface roughness, development defect, development residue (scum) and resolution.

As a result of the intensive investigations on the above-described performances of positive resist composition, it has been found that the objects of the invention are accomplished the specific composition described below to complete the invention.

Specifically, the present invention has the following constitution.

(1) A positive resist composition comprising (A) a compound that generates an acid upon irradiation of an actinic ray or radiation and (B) a resin having a property of increasing solubility in an alkali developing solution by the action of an acid and including a repeating unit containing a partial structure represented by formula (X) shown below and a repeating unit represented by formula (Y) shown below:

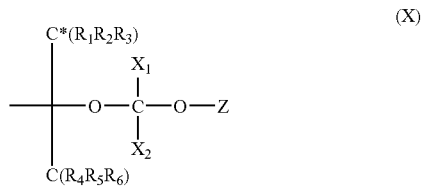

In formula (X), $R_1$ to $R_6$ each independently represent a hydrogen atom, a fluorine atom or a fluoroalkyl group, provided that at least one of $R_1$ to $R_6$ is not a hydrogen atom.

Instead, the carbon atom C* may be connected to a main chain of the resin directly or through a connecting group at any position of $R_1$ to $R_3$. $X_1$ and $X_2$ each independently represent a hydrogen atom or an alkyl group. Z represents a monovalent organic group having at least one cyclic hydrocarbon structure.

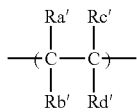

In formula (Y), $R_a'$, $R_b'$, $R_c'$ and $R_d'$ each independently represent a hydrogen atom, a fluorine atom or a fluoroalkyl group, provided that at least one of $R_a'$ to $R_d'$ is not a hydrogen atom.

(2) The positive resist composition as described in (1), wherein the resin of component (B) further includes a repeating unit containing an alicyclic structure having a hydroxy group or a hydroxyalkyl group.

(3) The positive resist composition as described in (1) or (2), wherein the organic group represented by Z in formula (X) includes an alicyclic hydrocarbon structure having at least one bridged structure.

(4) The positive resist composition as described in any one of (1) to (3), wherein the organic group represented by Z in formula (X) includes at least one of a fluorine atom and an alkyl group substituted with a fluorine atom.

(5). The positive resist composition as described in any one of (1) to (4), wherein the repeating unit containing a partial structure represented by formula (X) is at least one repeating unit selected from repeating units represented by the following formulae (IA) to (IC):

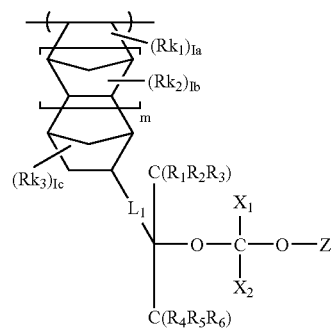

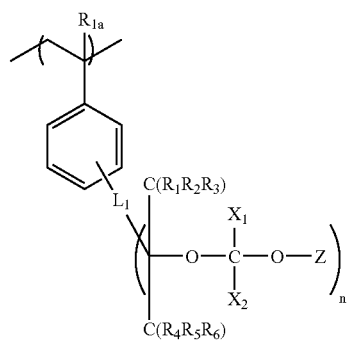

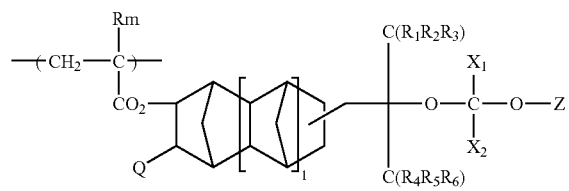

In formulae (IA) to (IC), $R_1$ to $R_6$ each independently represent a hydrogen atom, a fluorine atom or a fluoroalkyl group, provided that at least one of $R_1$ to $R_6$ is not a hydrogen atom. Instead, the carbon atom to which $R_3$ is connected may be connected to a main chain of the resin directly or through a connecting group. $X_1$ and $X_2$ each independently represent a hydrogen atom or an alkyl group. Z represents a monovalent organic group having at least one cyclic hydrocarbon structure. $R_{k1}$, $R_{k2}$ and $R_{k3}$ each represent a halogen atom or an alkyl group. L1 represents a single bond or a divalent connecting group. $R_{1a}$ represents a hydrogen atom, a fluorine atom, a chlorine atom, a bromine atom, a cyano group or a trifluoromethyl group. Rm represents a hydrogen atom, a fluorine atom, a methyl group or a trifluoromethyl group. Q represents a hydrogen atom or a hydroxy group m represents 0 or 1. 1a represents 0 or 1. 1b represents an integer of from 0 to 2. 1c represents an integer of from 0 to 5. n represents an integer of from 1 to 5. 1 represents 0 or 1.

(6) A pattern formation method comprising forming a resist film using the positive resist composition as described in any one of (1) to (5), exposing the resist film, and developing the exposed resist film.

The present invention also includes the following preferred embodiments.

(7) The positive resist composition as described in any one of (2) to (5), wherein the repeating unit containing an alicyclic structure having a hydroxy group or a hydroxyalkyl group is a repeating unit represented by the following formulae (II) or (III):

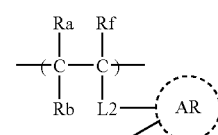

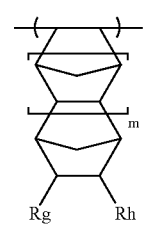

In formulae (II) and (III), $R_a$ and $R_b$ each independently represent a hydrogen atom, a fluorine atom, a methyl group or a fluoroalkyl group. Rf represents a hydrogen atom, a fluorine atom, a methyl group or a trifluoromethyl group. L2 represents —C(=O)—O— group or —O— group. AR represents alicyclic hydrocarbon structure. Rg and Rh each independently represent a hydrogen atom, a hydroxy group or a hydroxyalkyl group, provided that at least one of Rg and Rh is not a hydrogen atom. m represents 0 or 1. nc represents an integer of from 1 to 5.

(8) The positive resist composition as described in any one of (1) to (5) and (7), wherein the resin of component (B) further includes at least one repeating unit selected from repeating units represented by the following formulae (IV) to (VII):

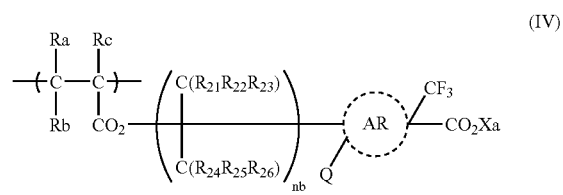

(IV)

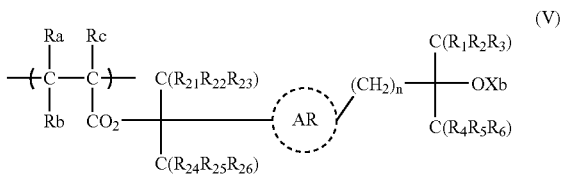

(V)

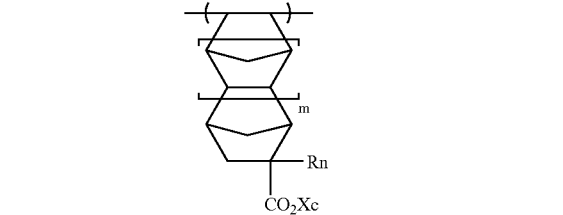

(VI)

(VII)

In formulae (IV) to (VII), $R_a$, $R_b$ and $R_c$ each independently represent a hydrogen atom, a fluorine atom, a methyl group or a fluoroalkyl group. $R_{21}$ to $R_{26}$ each independently represent a hydrogen atom, a fluorine atom or a fluoroalkyl group, provided that at least one of $R_{21}$ to $R_{26}$ is not a hydrogen atom. AR represents alicyclic hydrocarbon structure. Q represents a hydrogen atom or a hydroxy group. Xa represents a hydrogen atom or a group capable of being decomposed by the action of an acid. $R_1$ to $R_6$ each independently represent a hydrogen atom, a fluorine atom or a fluoroalkyl group, provided that at least one of $R_1$ to $R_6$ is not a hydrogen atom. Xb represents a hydrogen atom or a group capable of being decomposed by the action of an acid. Rn represents a fluorine atom or a trifluoromethyl group. Xc represents a hydrogen atom or a group capable of being decomposed by the action of an acid. Rd represents a hydrogen atom or a group capable of being decomposed by the action of an acid. nb represents 0 or 1. n represents 0 or 1. m represents 0 or 1.

DETAILED DESCRIPTION OF THE INVENTION

According to the present invention, a positive resist composition, which is improved in surface roughness, development defect, scum and resolution, can be provided.

The present invention will be described in detail below,

With respect to the description of a group (atomic group) in the specification, the term "group", which is not particularly referred to whether it is substituted or not, means and includes both unsubstituted and substituted groups. For instance, the description of an "alkyl group" includes not only an alkyl group having no substituent (unsubstituted alkyl group) but also an alkyl group having a substituent (substituted alkyl group).

[1] (B) Resin Having a Property of Increasing Solubility in an Alkali Developing Solution by the Action of an Acid and Including a Repeating Unit Containing a Partial Structure Represented by Formula (X) and a Repeating Unit Represented by Formula (Y)

The positive resist composition of the invention include a resin having a property of increasing solubility in an alkali developing solution by the action of an acid and including a repeating unit containing a partial structure represented by formula (X) shown below and a repeating unit represented by formula (Y) shown below (hereinafter also referred to as "resin of Component (B)" or "resin (B)").

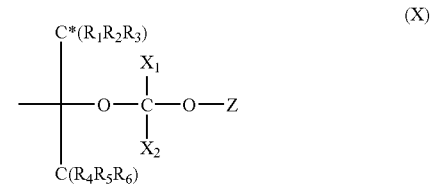

(X)

In formula (X), $R_1$ to $R_6$ each independently represents a hydrogen atom, a fluorine atom or a fluoroalkyl group, provided that at least one of $R_1$ to $R_6$ is not a hydrogen atom. Instead, the carbon atom C* may be connected to a main chain of the resin directly or through a connecting group at any position of $R_1$ to $R_3$. $X_1$ and $X_2$ each independently represents a hydrogen atom or an alkyl group. Z represents a monovalent organic group having at least one cyclic hydrocarbon structure.

(Y)

In formula (Y), $R_a'$, $R_b'$, $R_c'$ and $R_d'$ each independently represents a hydrogen atom, a fluorine atom or a fluoroalkyl group, provided that at least one of $R_a'$ to $R_d'$ is not a hydrogen atom.

The fluoroalkyl group represented by any one of $R_1$ to $R_6$ in formula (X) means an alkyl group in which at least one of the hydrogen atoms is fluorinated. The fluoroalkyl group has preferably from 1 to 6 carbon atoms, and more preferably from 1 to 3 carbon atoms. Specific examples of the fluoroalkyl group include trifluoromethyl, difluoromethyl, fluoromethyl, pentafluoroethyl, 2,2,2-trifluoroethyl, 2-fluoroethyl, 0.3,3,3-trifluoropropyl and 3-fluoropropyl groups. A trifluoromethyl group is particularly preferred.

The fluoroalkyl group represented by any one of $R_1$ to $R_6$ may have a substituent. Examples of the substituent include a chlorine atom, a bromine atom and an iodine atom.

$R_1$ to $R_6$ each preferably represents a fluorine atom.

The —$C^*(R_1R_2R_3)$ means a group wherein each group represented by $R_1$, $R_2$ or $R_3$ is connected to the carbon atom $C^*$ with a single bong. Hereinafter the same shall apply.

The alkyl group represented by any one of $X_1$ and $X_2$ is preferably an alkyl group having from 1 to 6 carbon atoms, and more preferably an alkyl group having from 1 to 3 carbon atoms. Specific examples of the alkyl group include methyl, ethyl, propyl, isopropyl, n-butyl, isobutyl, sec-butyl and pentyl groups.

$X_1$ and $X_2$ each preferably represents a hydrogen atom.

The cyclic hydrocarbon structure included in Z includes, for example, cyclopropyl ring, cyclobutyl ring, cyclopentyl ring and cyclohexyl ring. The cyclic hydrocarbon structure included in Z is preferably an alicyclic hydrocarbon structure having at least one bridged structure. Specific examples thereof include the following ring structures:

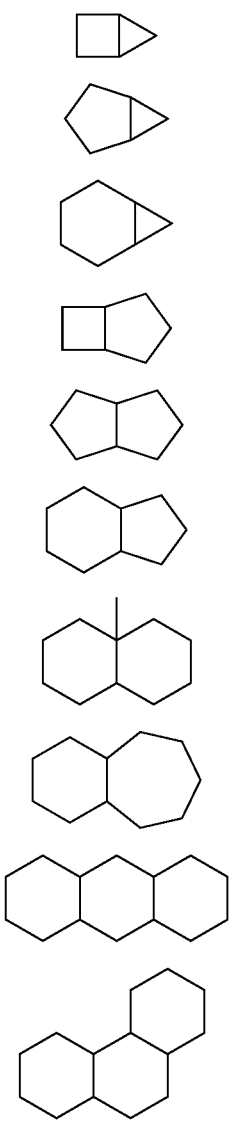

(1) (2) (3) (4) (5) (6) (7) (8) (9) (10)

-continued

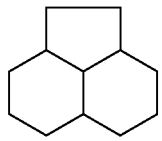
(11)

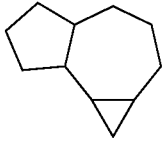
(12)

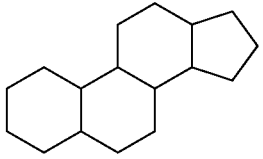
(13)

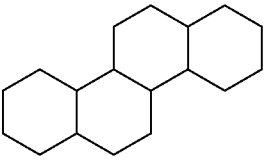
(14)

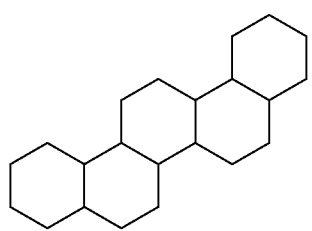
(15)

(16)

(17)

(18)

(19)

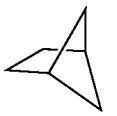
(20)

(21)

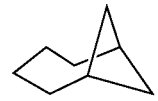
(22)

-continued
 (23)
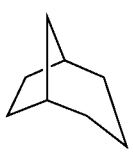 (24)
 (25)
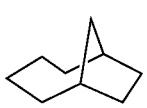 (26)
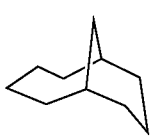 (27)
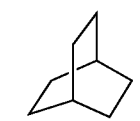 (28)
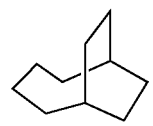 (29)
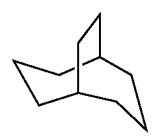 (30)
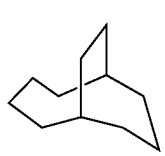 (31)
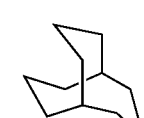 (32)
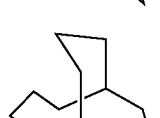 (33)
 (34)
-continued
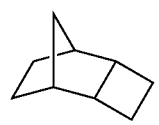 (35)
 (36)
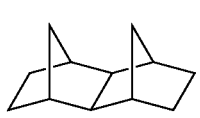 (37)
 (38)
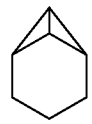 (39)
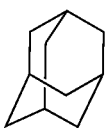 (40)
 (41)
 (42)
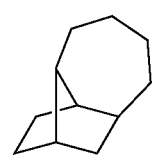 (43)
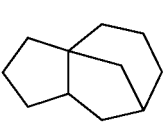 (44)
 (45)
 (46)
 (47)

-continued

(48)

(49)

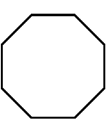
(50)

Preferred examples of the alicyclic hydrocarbon structure having at least one bridged structure include an alicyclic hydrocarbon group, for example, an adamantyl group, a noradamantyl group, a tricyclodecanyl group, a tetracyclododecanyl group, a norbonyl group or a cedrol group. Of these, an adamantyl group, a decalin residue, a norbonyl group and a cedrol group are more preferable.

Examples of the substituent for the alicyclic hydrocarbon group include an alkyl group, a substituted alkyl group, a cycloalkyl group, a halogen atom, a hydroxy group, an alkoxy group, a carboxy group and an alkoxycarbonyl group.

The alkyl group is preferably a lower alkyl group, for example, a methyl group, an ethyl group, a propyl group, an isopropyl group or a butyl group, and more preferably a methyl group, an ethyl group, a propyl group and an isopropyl group. Examples of the substituent for the substituted alkyl group include a hydroxy group, a halogen atom and an alkoxy group.

Examples of the alkoxy group (including the alkoxy group in the alkoxycarbonyl group) includes those having from 1 to 4 carbon atoms, for example, a methoxy group, an ethoxy group, a propoxy group or a butoxy group.

Examples of the cycloalkyl group include a cyclopropyl group, a cyclopentyl group and a cyclohexyl group.

The alkenyl group includes an alkenyl group having from 2 to 6 carbon atoms, specifically, for example, a vinyl group, a propenyl group, an allyl group, a butenyl group, a pentenyl group and a hexenyl group.

Examples of the acyl group include an acetyl group, a ethylcarbonyl group and a propylcarbonyl group. Examples of the halogen atom include a chlorine atom, a bromine atom, an iodine atom and a fluorine atom.

The monovalent organic group having at least one cyclic hydrocarbon structure represented by Z may be an alicyclic hydrocarbon group per se or a group connecting an alicyclic hydrocarbon group with a straight chain or branched alkylene group, an oxy group or the like. Examples of the alkylene group include a methylene group, ethylene group a propylene group, a butylene group and a hexylene group. The straight chain or branched alkylene group may have a substituent, for example, a fluorine atom or an alky group substituted with a fluorine atom.

The monovalent organic group having at least one cyclic hydrocarbon structure represented by Z has at least one substituent selected from a fluorine atom and an alkyl group substituted with a fluorine atom is preferred because absorption at 157 nm can be reduced. The fluorine atom and an alkyl group substituted with a fluorine atom may be connected directly or through a connecting group to the alicyclic hydrocarbon group and/or alkylene group. The alkyl group substituted with a fluorine atom has the same meaning as defined for the fluoroalkyl group represented by any one of $R_1$ to $R_6$.

The —$C(X_1X_2)$—O—Z group in the partial structure represented by formula (X) is a group (acid-decomposable group) capable of being decomposed by the action of an acid. The —$C(X_1X_2)$—O—Z group is decomposed by the action of an acid to generate a hydrophilic hydroxy group, whereby the resin (B) increases solubility in an alkaline developing solution by the action of an acid.

A repeating unit containing a partial structure represented by formula (X) includes repeating units represented by the following formulae (IA) to (IC):

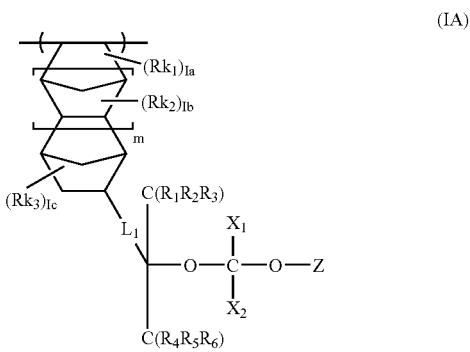
(IA)

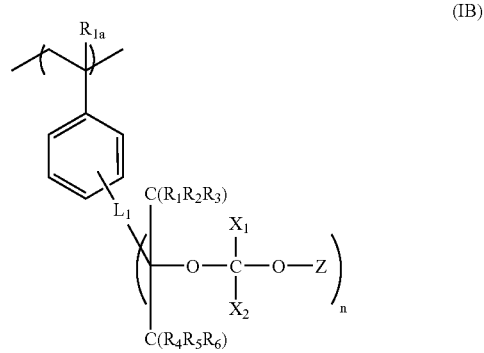
(IB)

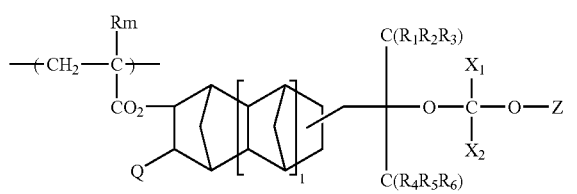
(IC)

In formulae (IA) to (IC), $R_1$ to $R_6$ each independently represents a hydrogen atom, a fluorine atom or a fluoroalkyl group, provided that at least one of $R_1$ to $R_6$ is not a hydrogen atom. Instead, the carbon atom to which $R_3$ is connected may be connected to a main chain of the resin directly or through a connecting group. $X_1$ and $X_2$ each independently represent a hydrogen atom or an alkyl group. Z represents a monovalent organic group having at least one cyclic hydrocarbon structure. $R_{k1}$, $R_{k2}$ and $R_{k3}$ each represent a halogen atom or an alkyl group. L1 represents a single bond or a divalent connecting group. $R_{1a}$ represents a hydrogen atom, a fluorine atom, a chlorine atom, a bromine atom, a cyano group or a trifluoromethyl group. Rm represents a hydrogen atom, a fluorine atom, a methyl group or a trifluoromethyl group. Q represents a hydrogen atom or a hydroxy group. m represents 0 or 1. 1a represents 0 or 1. 1b represents an integer of from 0 to 2. 1c represents an integer of from 0 to 5. n represents an integer of from 1 to 5. l represents 0 or 1.

$R_1$ to $R_6$ in formulae (IA) to (IC) have the same meanings as $R_1$ to $R_6$ in formula (X) $X_1$ and $X_2$ have the same meanings as $X_1$ and $X_2$ in formula (X). Z has the same meaning as Z in formula (X).

The halogen atom represented by any one of $R_{k1}$ to $R_{k3}$ includes a fluorine atom, a chlorine atom, a bromine atom and an iodine atom.

The alkyl group represented by any one of $R_{k1}$ to $R_{k3}$ preferably includes an alkyl group having from 1 to 5 carbon atoms, for example, methyl, ethyl, propyl, isopropyl, n-butyl, isobutyl and sec-butyl groups. The alkyl group represented by any one of $R_{k1}$ to $R_{k3}$ may have a substituent, for example, a fluorine atom.

1a is preferably 0. 1b is preferably 0. 1c is preferably an integer of from 0 to 3.

When the sum total of 1a, 1b and 1c is 1 or more, $R_{k1}$ to $R_{k3}$ each preferably represent a fluorine atom or an alkyl group (preferably having from 1 to 8 carbon atoms, more preferably having from 1 to 2 carbon atoms) substituted with a fluorine atom, and more preferably each represent a fluorine atom or a trifluoromethyl group.

The divalent connecting group represented by $L_1$ includes, for example, an alkylene group, a cycloalkylene group, an alkenylene group, an arylene group, —O—$R_{22a}$, —O—CO—$R_{22b}$—, —CO—O—$R_{22c}$— and —CO—N($R_{22d}$)—$R_{22e}$—. $R_{22a}$, $R_{22b}$, $R_{22c}$ and $R_{22e}$ each represent a single bond or a divalent alkylene group, cycloalkylene group, alkenylene group or arylene group, which may contain an ether group, an ester group, an amido group a urethane group or a ureido group. $R_{22de}$ represents a hydrogen atom, an alkyl group, a cycloalkyl group, an aralkyl group or an aryl group.

The alkylene group includes a straight chain and branched alkylene group and an alkylene group having from 1 to 8 carbon atoms, for example, methylene, ethylene, propylene, butylene, hexylene or octylene group.

The cycloalkylene group preferably includes a cycloalkyl group having from 5 to 12 carbon atoms, and may be a monocyclic residue, for example, cyclopentylene or cyclohexylene group, or a polycyclic residue, for example, norbornane or adamantane skeleton.

The alkenylene group preferably includes an alkylene group having from 2 to 6 carbon atoms, for example, ethenylene, propenylene or butenylen group.

The arylene group preferably includes an arylene group having from 6 to 15 carbon atoms, for example, phenylene, tolylene or naphthylene group.

The substituent which the divalent connecting group represented by $L_1$ may have includes, for example, a halogen atom, e.g., fluorine or chlorine atom, and a cyano group, and preferably a fluorine atom.

$L_1$ preferably represents a single bong, a methylene group or an —O— group.

Specific examples of the repeating unit containing a partial structure represented by formula (X) and specific examples of the repeating unit represented by any one of formulae (IA) to (IC) are set forth below, but the invention should not be construed as being limited thereto.

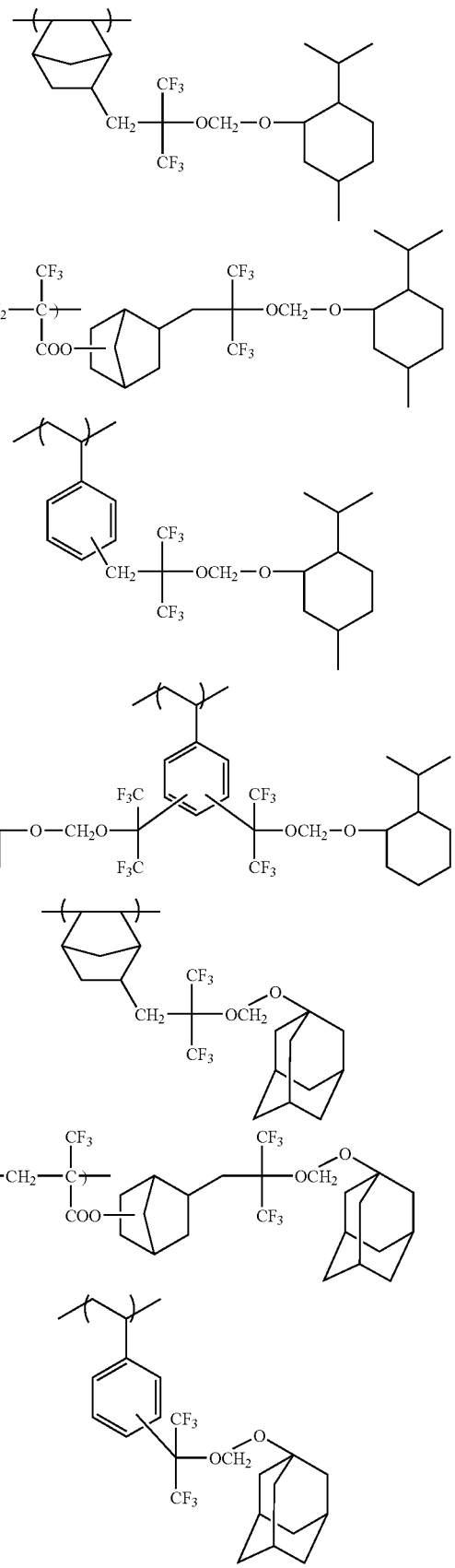

-continued

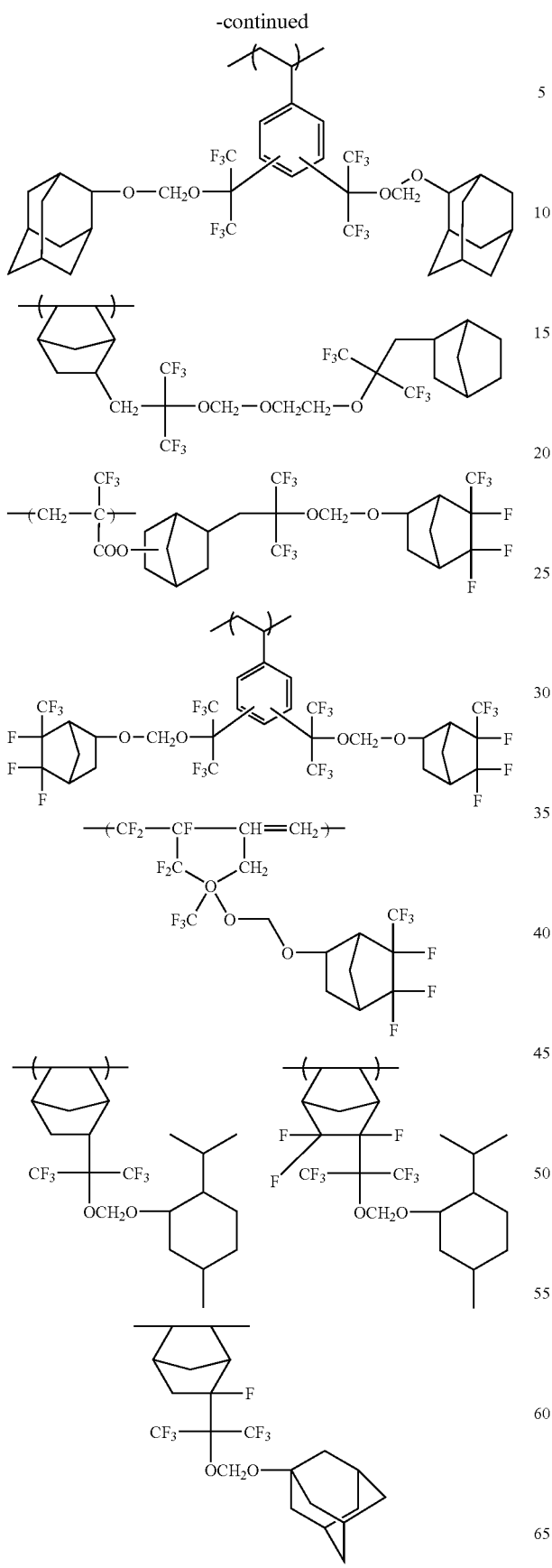

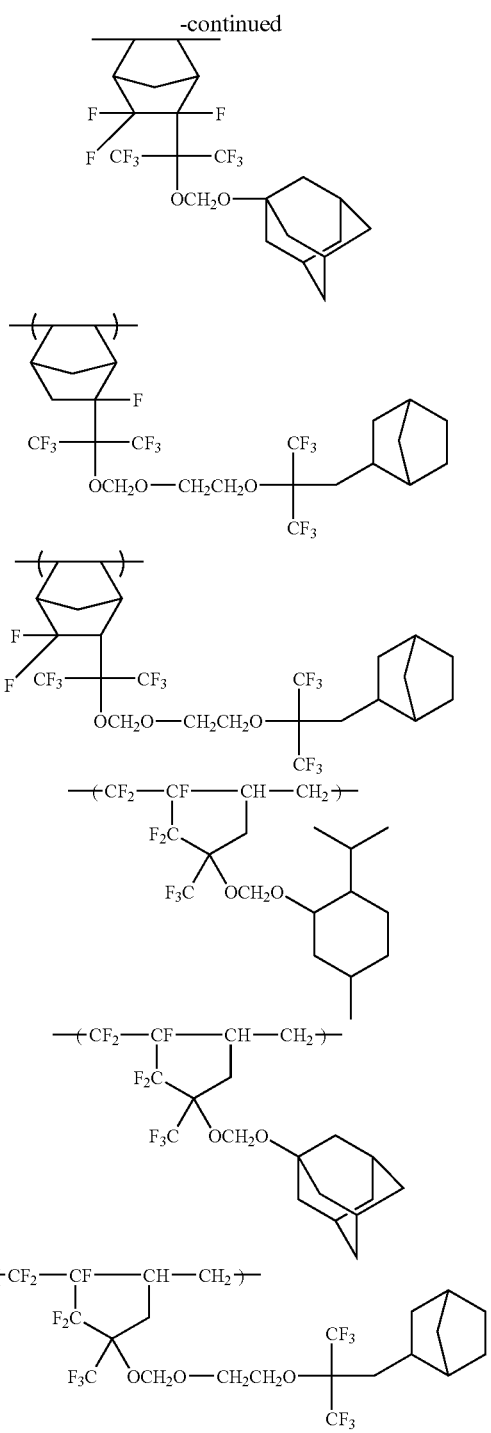

The fluoroalkyl group represented by any one of $R_a'$, $R_b'$, $R_c'$ and $R_d'$ in formula (Y) has the same meaning as the fluoroalkyl group represented by any one of $R_1$ to $R_6$ in formula (X).

$R_a'$, $R_b'$, $R_c'$ and $R_d'$ preferably represents a fluorine atom or a fluoroalkyl group, and more preferably a fluorine atom or a trifluoromethyl group.

Specific examples of the repeating unit represented by formula (Y) are set forth below, but the invention should not be construed as being limited thereto.

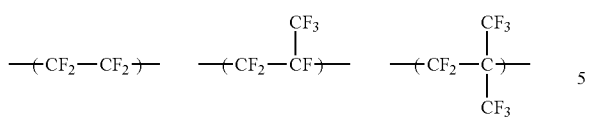

It is preferred that the resin (B) further includes a repeating unit containing an alicyclic structure having a hydroxy group or a hydroxyalkyl group.

The repeating unit containing an alicyclic structure having a hydroxy group or a hydroxyalkyl group is preferably a repeating unit represented by the following formulae (II) or (III):

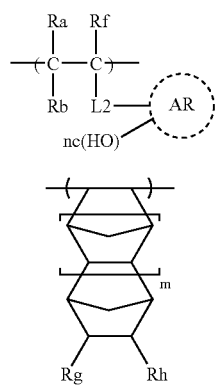

In formulae (II) and (III), $R_a$ and $R_b$ each independently represents a hydrogen atom, a fluorine atom, a methyl group or a fluoroalkyl group. Rf represents a hydrogen atom, a fluorine atom, a methyl group or a trifluoromethyl group. L2 represents —C(=O)—O— group or —O— group. AR represents alicyclic hydrocarbon structure. Rg and Rh each independently represents a hydrogen atom, a hydroxy group or a hydroxyalkyl group, provided that at least one of Rg and Rh is not a hydrogen atom. m represents 0 or 1. nc represents an integer of from 1 to 5.

The fluoroalkyl group represented by any one of $R_a$ and $R_b$ in formula (II) has the same meaning as the fluoroalkyl group represented by any one of $R_1$ to $R_6$ in formula (X).

The alicyclic hydrocarbon structure represented by AR may be monocyclic or polycyclic. Specifically, the alicyclic hydrocarbon structure includes alicyclic hydrocarbon structures having not less than 5 carbon atoms, for example, a monocyclo, bicyclo, tricyclo or tetracyclo structure. The number of carbon atoms included therein is preferably from 6 to 30, and particularly preferably from 7 to 25.

Preferred examples of the alicyclic hydrocarbon structure represented by AR include adamantane, noradamantane, decalin, tricyclodecane, tetracyclododecane, norbornane, cyclohexane, cycloheptane, cyclooctane, cyclodecane and cyclododecane structures. Of these structures, adamantane, norbornane and cyclohexane structures are more preferred.

The alicyclic hydrocarbon structure represented by AR may further have a substituent, for example, an alkyl group, an alkoxy group or a halogen atom (for example, fluorine or chlorine atom).

The hydroxyalkyl group represented by any one of Rg and Rh preferably includes a hydroxyalkyl group having from 1 to 3 carbon atoms, for example, hydroxymethyl or hydroxyethyl group.

Specific examples of the repeating unit represented by formula (II) are set forth below, but the invention should not be construed as being limited thereto.

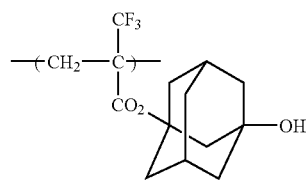

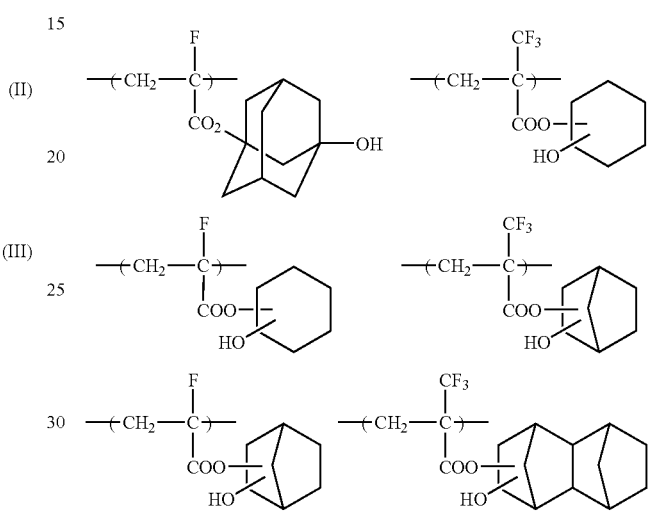

Specific examples of the repeating unit represented by formula (III) are set forth below, but the invention should not be construed as being limited thereto.

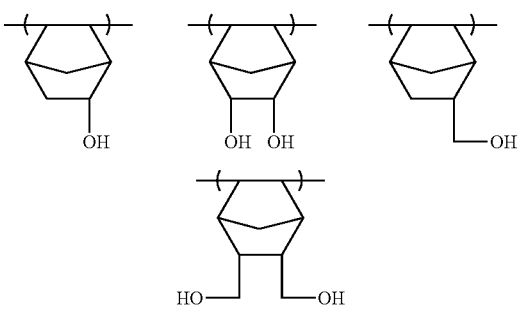

It is preferred that the resin (B) further includes at least one repeating unit selected from repeating units represented by the following formulae (IV) to (VII):

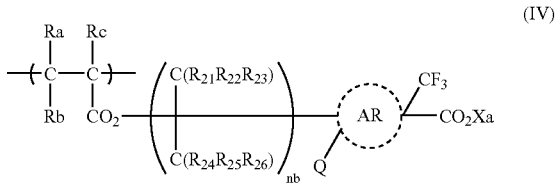

-continued

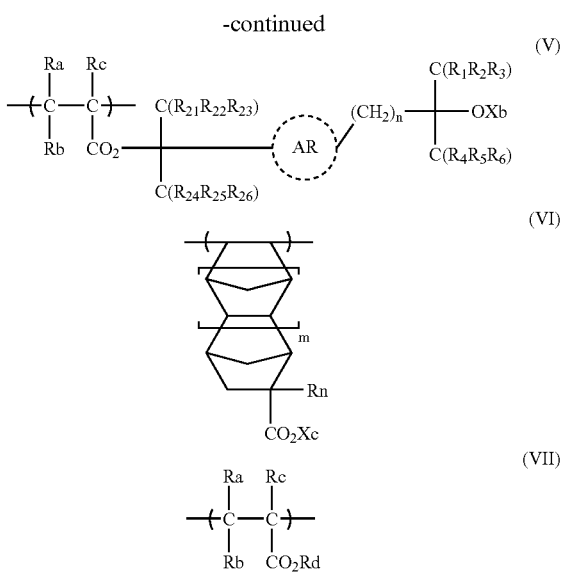

In formulae (IV) to (VII), $R_a$, $R_b$ and $R_c$ each independently represents a hydrogen atom, a fluorine atom, a methyl group or a fluoroalkyl group. $R_{21}$ to $R_{26}$ each independently represents a hydrogen atom, a fluorine atom or a fluoroalkyl group, provided that at least one of $R_{21}$ to $R_{26}$ is not a hydrogen atom. AR represents alicyclic hydrocarbon structure. Q represents a hydrogen atom or a hydroxy group. Xa represents a hydrogen atom or a group capable of being decomposed by the action of an acid. $R_1$ to $R_6$ each independently represents a hydrogen atom, a fluorine atom or a fluoroalkyl group, provided that at least one of $R_1$ to $R_6$ is not a hydrogen atom. Xb represents a hydrogen atom or a group capable of being decomposed by the action of an acid. Rn represents a fluorine atom or a trifluoromethyl group. Xc represents a hydrogen atom or a group capable of being decomposed by the action of an acid. Rd represents a hydrogen atom or a group capable of being decomposed by the action of an acid. nb represents 0 or 1. n represents 0 or 1. m represents 0 or 1.

The fluoroalkyl group represented by any one of $R_a$, $R_b$ and $R_c$ has the same meaning as the fluoroalkyl group represented by any one of $R_1$ to $R_6$ in formula (X).

$R_{21}$ to $R_{26}$ have the same meanings as $R_1$ to $R_6$ in formula (X). $R_{21}$ to $R_{26}$ each preferably represents a fluorine atom.

$R_1$ to $R_6$ have the same meanings as $R_1$ to $R_6$ in formula (X).

The alicyclic hydrocarbon structure represented by AR has the same meaning as the alicyclic hydrocarbon structure represented by Ar in formula (II).

The group (hereinafter also referred to as an acid-decomposable group) capable of being decomposed by the action of an acid represented by any one of Xa, Xb, Xc and Rd includes, for example, —C($R_{36}$) ($R_{37}$) ($R_{38}$), —C($R_{36}$) ($R_{37}$) (O$R_{39}$), —COO—C($R_{36}$) ($R_{37}$) ($R_{38}$), —C ($R_{01}$) ($R_{02}$) (O$R_{39}$) and —C($R_{01}$) ($R_{02}$) COO—C($R_{36}$) ($R_{37}$) ($R_{38}$).

$R_{36}$ to $R_{39}$ each independently represent an alkyl group, a cycloalkyl group, an alkenyl group, an aralkyl group or an aryl group. $R_{36}$ and $R_{37}$ or $R_{36}$ and $R_{39}$ may be combined with each other to from a ring, $R_{01}$ and $R_{02}$ each independently represent a hydrogen atom, an alkyl group, a cycloalkyl group, an alkenyl group, an aralkyl group or an aryl group.

The —C($R_{36}$)($R_{37}$) ($R_{38}$) means a group wherein each group represented by $R_{36}$, $R_{37}$ or $R_{38}$ is connected to the carbon atom with a single bong. Hereinafter the same shall apply.

The alkyl group represented by any one of $R_{36}$ to $R_{39}$, $R_{01}$ and $R_{02}$ preferably includes an alkyl group having from 1 to 8 carbon atoms, for example, methyl, ethyl, propyl, n-butyl, sec-butyl, hexyl, 2-ethylhexyl or octyl group.

The cycloalkyl group represented by any one of $R_{36}$ to $R_{39}$, $R_{01}$ and $R_{02}$ may be monocyclic or polycyclic. The monocyclic cycloalkyl group preferably includes a cycloalkyl group hating from 3 to 8 carbon atoms, for example, cyclopropyl, cyclopentyl, cyclohexyl, cycloheptyl or cyclooctyl group. The polycyclic cycloalkyl group preferably includes a cycloalkyl group having from 6 to 20 carbon atoms, for example, adamantyl, norbornyl, isobornyl, camphanyl, dicyclopentyl, α-pinenyl, tricyclodecanyl, tetracyclododecyl or androstanyl group. The carbon atoms in the monocyclic or polycyclic cycloalkyl group may be partially replaced with hetero atoms, for example, an oxygen atom.

The aryl group represented by any one of $R_{36}$ to $R_{39}$, $R_{01}$ and $R_{02}$ preferably includes an aryl group having from 6 to 10 carbon atoms, for example, phenyl, tolyl, dimethylphenyl, 2,4,6-trimethylphenyl, naphthyl, anthryl or 9,10-dimethoxyanthryl group.

The aralkyl group represented by any one of $R_{36}$ to $R_{39}$, $R_{01}$ and $R_{02}$ preferably includes an aralkyl group having from 7 to 12 carbon atoms, for example, benzyl, phenethyl or naphthylmethyl group.

The alkenyl group represented by any one of $R_{36}$ to $R_{39}$, $R_{01}$ and $R_{02}$ preferably includes an alkenyl group having from 2 to 8 carbon atoms, for example, vinyl, allyl, butenyl or cyclohexenyl group.

The substituent which the groups represented by $R_{36}$ to $R_{39}$, $R_{01}$ and $R_{02}$ may have includes, for example, an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

Specific preferred examples of the acid-decomposable group include, for example, a tertiary alkyl group, e.g., tert-butyl, tert-amyl, 1-alkyl-1-cyclohexyl, 2-alkyl-2-adamantyl, 2-adamantyl-2-propyl or 2-(4-methylcyclohexyl)-2-propyl group, an acetal group, e.g., 1-alkoxy-1-ethoxy, 1-alkoxy-1-methoxy or tetrahydropyranyl group, a tert-alkyloxycarbonyl group, an ethoxymethyl group, a methoxyethoxymethyl group and a tert-alkylcarbonylmethyl group.

Specific examples of the repeating unit represented by formula (IV) are set forth below, but the invention should not be construed as being limited thereto.

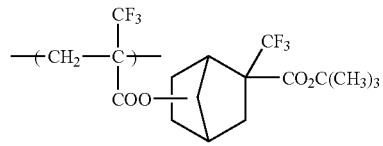

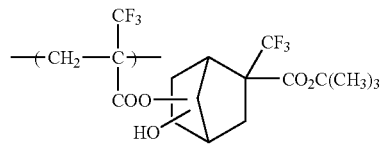

-continued
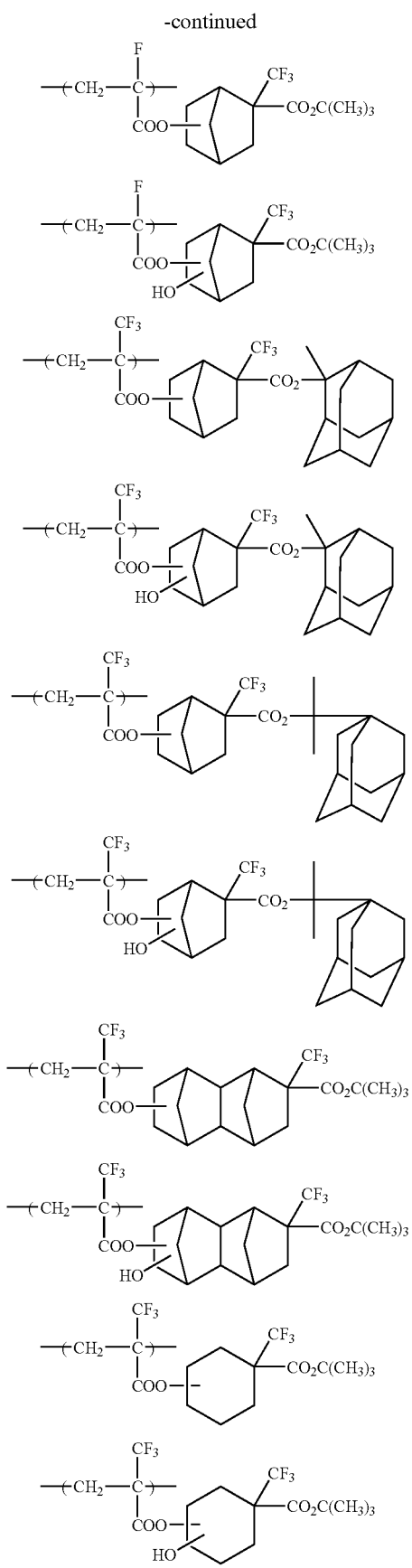
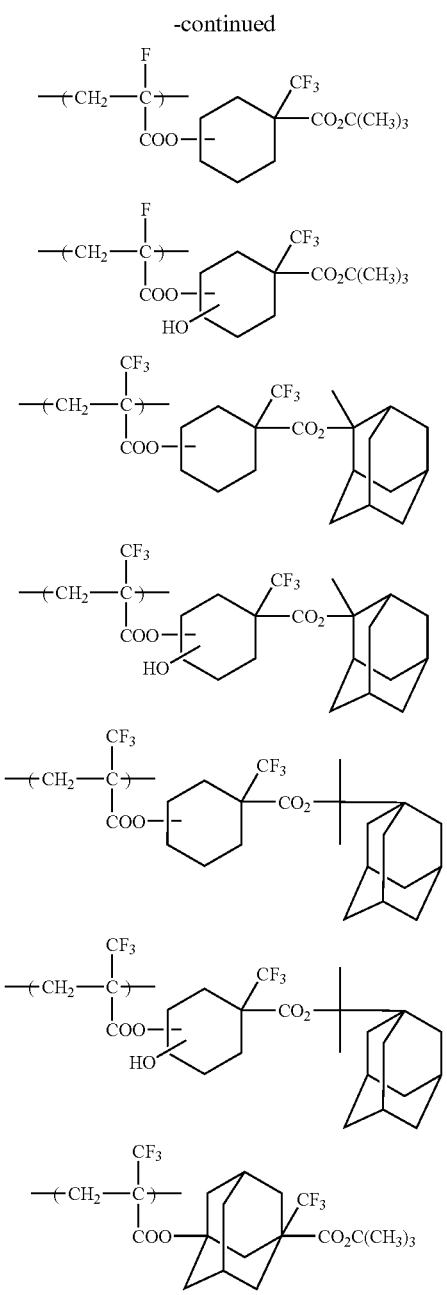
Specific examples of the repeating unit represented by formula (V) are set forth below, but the invention should not be construed as being limited thereto.
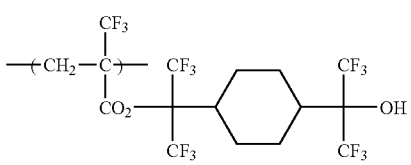
Specific examples of the repeating unit represented by formula (VI) are set forth below, but the invention should not be construed as being limited thereto.

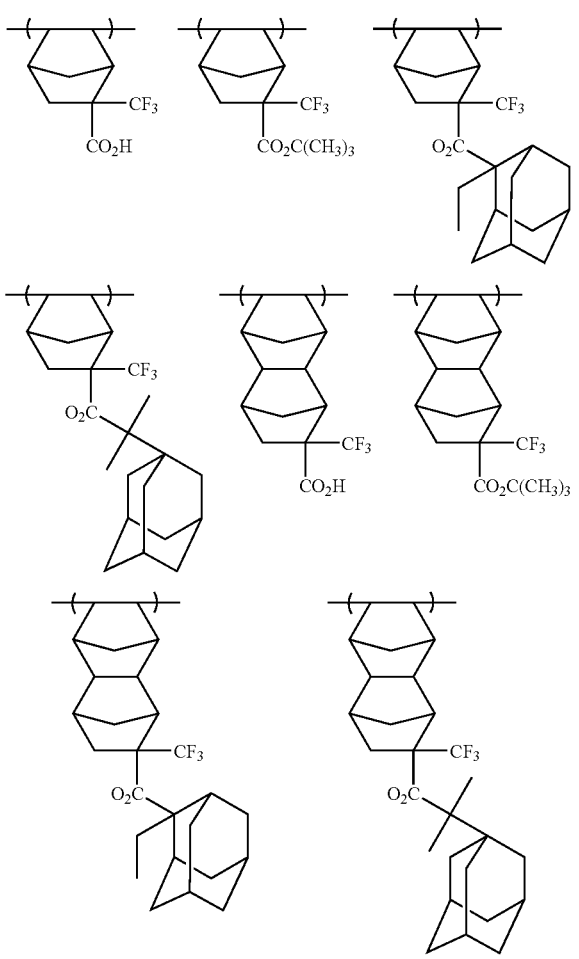

Specific examples of the repeating unit represented by formula (VII) are set forth below, but the invention should not be construed as being limited thereto.

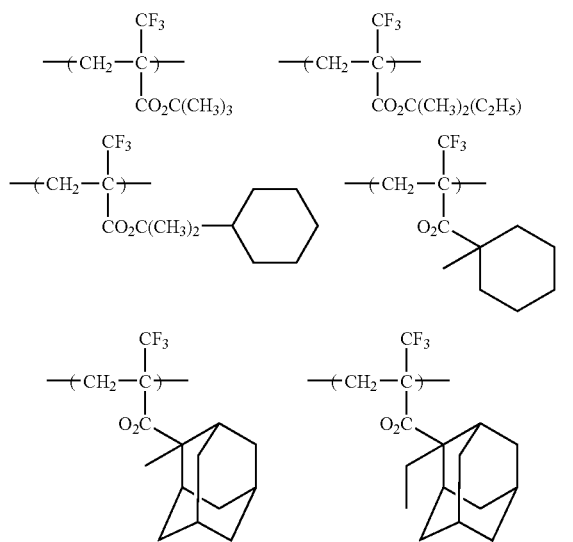

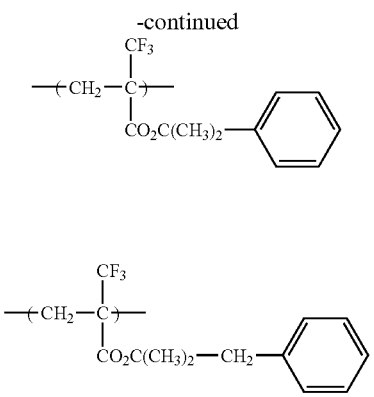

It is preferred that the resin (B) further includes a repeating unit formed by replacing the —C($X_1X_2$)—O—Z group in the repeating unit represented by any one of formulae (IA) to (IC) with a hydrogen atom. Specific examples of the respective repeating units include repeating units formed by replacing the —C($X_1X_2$)—O—Z group with a hydrogen atom in the specific examples of the repeating unit represented by formulae (IA) to (IC).

The resin of Component (B) may further contain a repeating unit formed from other polymerizable monomer in addition to the repeating units described above.

Examples of the copolymerizable monomer include an acrylate, an acrylamide, a methacrylate, a methacrylamide, an allyl compound, a vinyl ester, a styrene, a crotonate, a dialkyl maleate, a dialkyl fumarate, maleic anhydride, a maleimide, acrylonitrile, methacrylonitrile, maleonitrile and C($R_{1a}$) ($R_{2a}$)=C($R_{3a}$) ($R_{4a}$) (wherein $R_{1a}$ to $R_{4a}$, which may be the same or different, each represent a hydrogen atom, a halogen atom or an alkyl group (preferably having from 1 to 10 carbon atoms), which may be substituted with a halogen atom). Acrylonitrile, methacrylonitrile, maleic anhydride, a maleimide, N-hydroxymaleimide, N-(tert-butoxycarbonyloxy) maleimide and C($R_{1a}$) ($R_{2a}$)=C($R_{3a}$) ($R_{4a}$) are particularly preferred. In addition, any addition polymerizable unsaturated compound copolymerizable with monomers corresponding to the repeating units described above may be ordinarily employed.

Specific preferred examples of the resin of Component (B) are set forth below, but the invention should not be construed as being limited thereto.

(F-1)

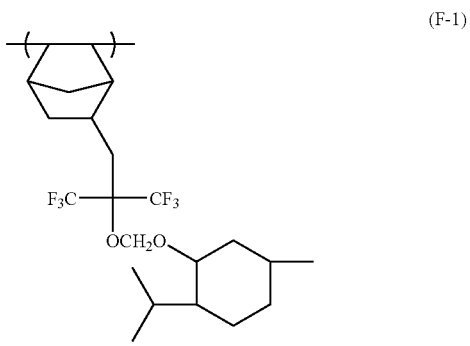

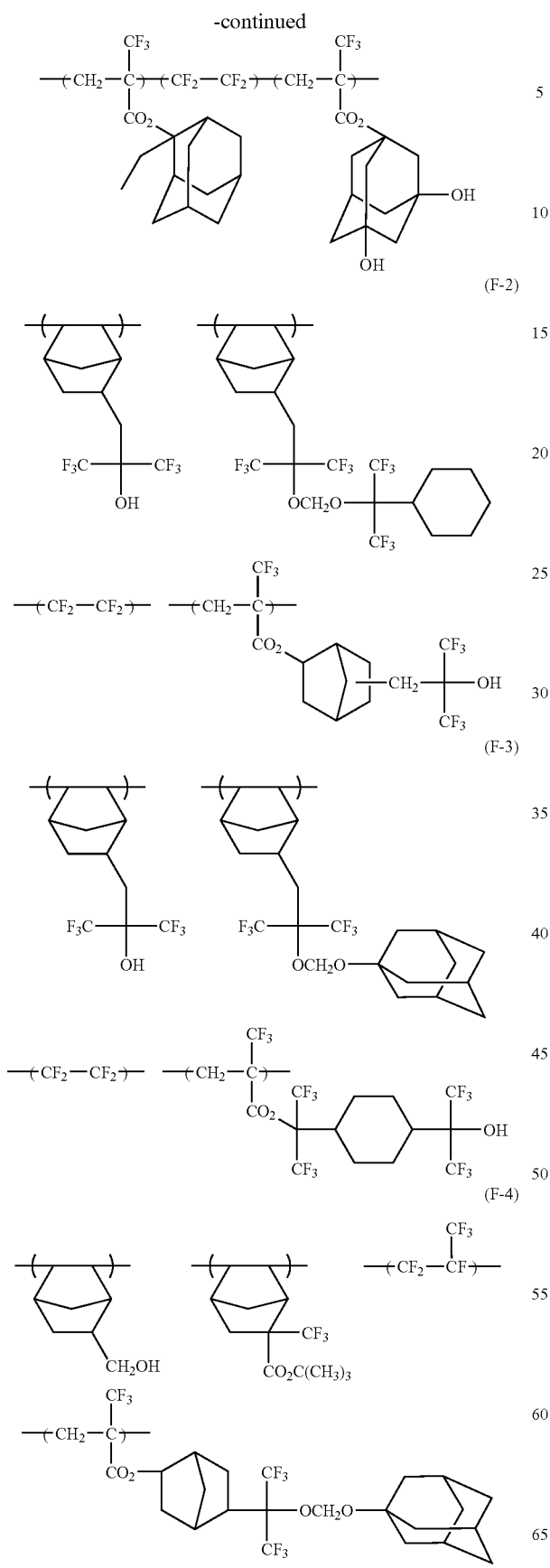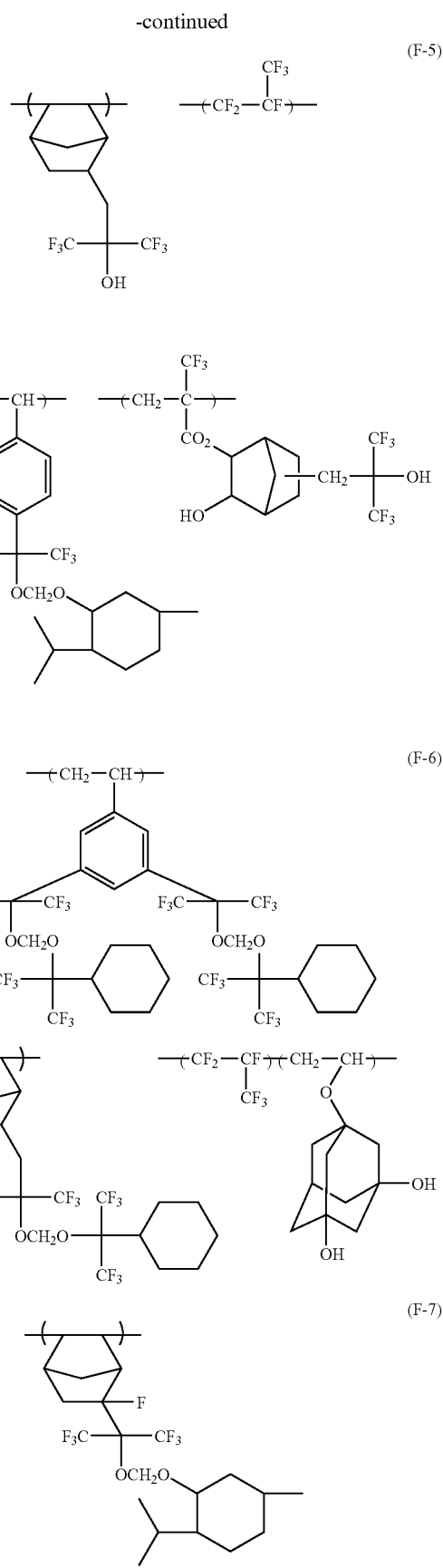

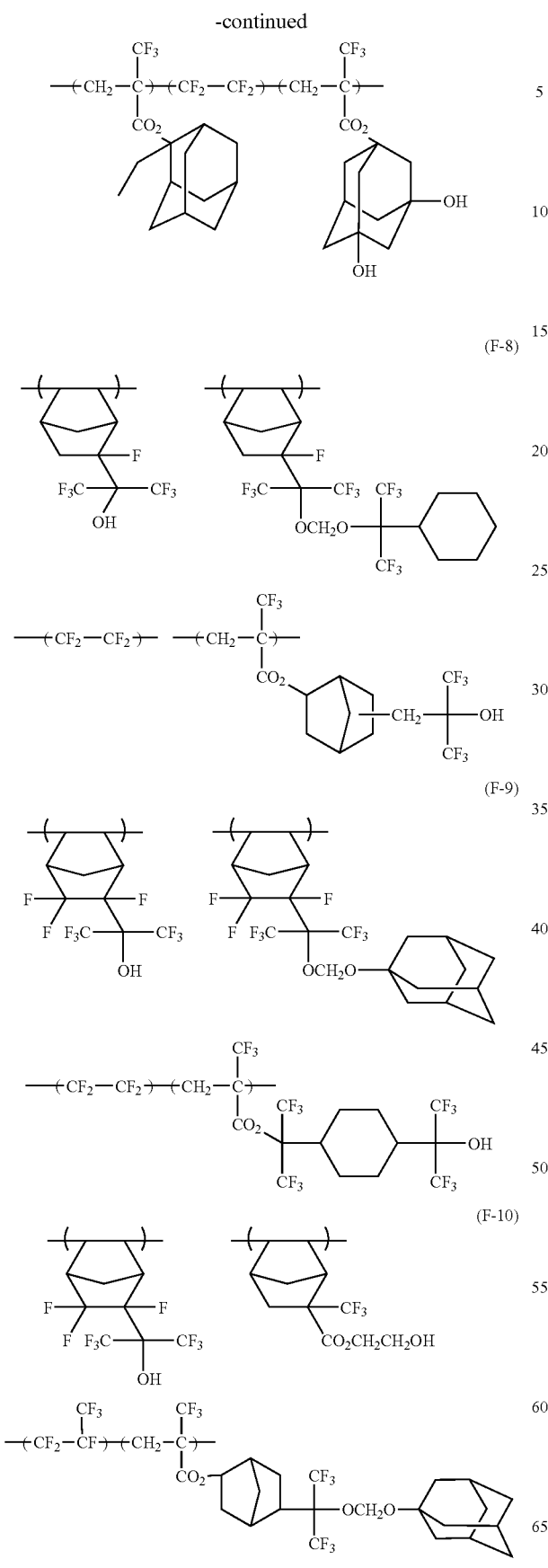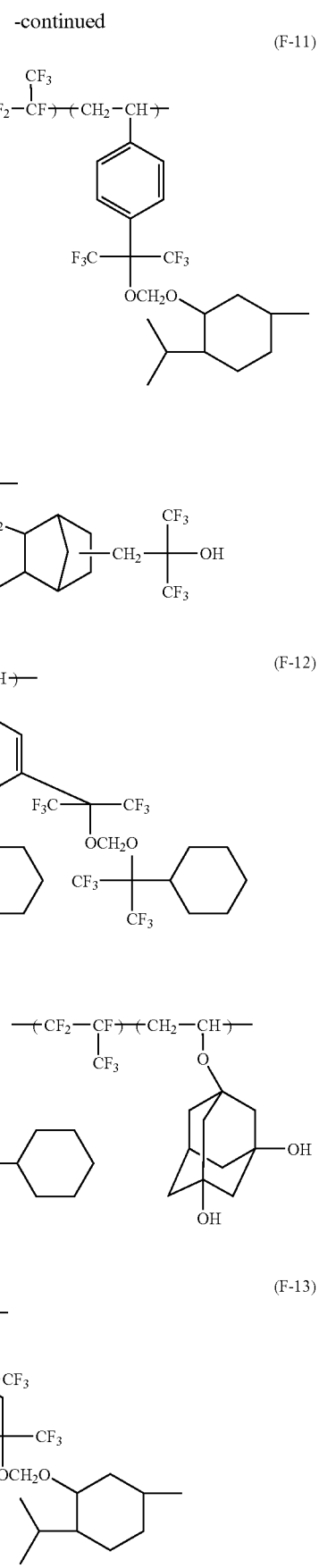

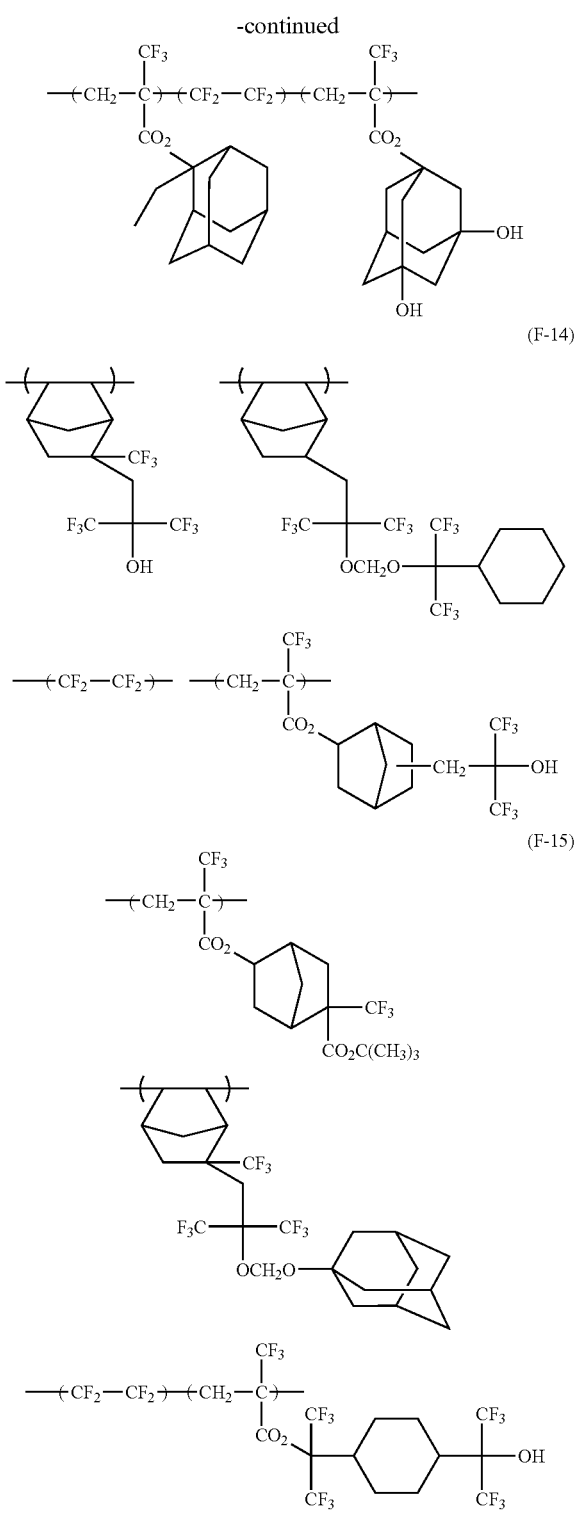

In the resin of Component (B), the content of the repeating unit containing a partial structure represented by formula (X) is preferably from 10 to 60% by mole, and more preferably from 20 to 40% by mole.

In the resin of Component (B), the content of the repeating unit represented by formula (Y) is preferably from 10 to 70% by mole, and more preferably from 20 to 50% by mole.

In the resin of Component (B), the content of the repeating unit containing an alicyclic structure having a hydroxy group or a hydroxyalkyl group is preferably from 5 to 40% by mole, and more preferably from 10 to 30% by mole.

In the resin of Component (B), the content of the repeating units represented by formulae (IV) to (VII) is preferably from 5 to 40% by mole, and more preferably from 10 to 30% by mole.

In the resin of Component (B), the content of the repeating unit containing an acid-decomposable group is preferably from 10 to 60% by mole, and more preferably from 20 to 50% by mole.

The molecular weight of the resin of Component (B) is preferably from 2,000 to 50,000, more preferably from 3,000 to 30,000, and particularly preferably from 5,000 to 15,000, in terms of a weight average molecular weight.

The dispersion degree of molecular weight (Mw/Mn) is preferably from 1.0 to 3.0, more preferably from 1.1 to 2.0, and particularly preferably from 1.1 to 1.5. In order to reduce the dispersion degree of molecular weight, there are a method in which a polymer obtained by a conventional radical polymerization is dissolved in a good solvent and then a poor solvent is added thereto to remove low molecular weight components and a method using a living polymerization method, for example, a living radical polymerization method, and any of these methods can be preferably employed.

As the living radical polymerization method, any of method using nitroxide by M. K. Georges et al. and method using metal complex by Mitsuo Sawamoto et al. or Krzysztof Matyjaszewski, all described in Controlled Radical Polymerization (ACS Symposium Series, No 685) can be used.

From the standpoint of improvement in the roughness of pattern, it is preferred to apply a dropping polymerization method (radical polymerization method in which during radical polymerization of monomer in the presence of a radical polymerization initiator, a monomer is further added continuously or intermittently) to the above-described conventional radical polymerization method.

In the dropping polymerization method, species and composition of monomer put in first in a reaction vessel and species and composition of monomer added later in progress of the radical polymerization may be the same or different.

Also, with respect to the polymerization initiator, it is preferred to utilize a method of further adding it together with the monomer added later because an amount of the remaining unreacted monomer is reduced.

The resin of Component (B) is used in an amount ordinarily from 50 to 99.5% by weight, preferably from 80 to 99% by weight, and more preferably from 90 to 98% by weight, based on the total solid content of the resist composition.

[2] (A) Compound that Generates an Acid Upon Irradiation of an Actinic Ray or Radiation The positive resist composition of the invention includes a compound that generates an acid upon irradiation of an actinic ray or radiation, particularly an $F_2$ excimer laser beam.

The compound that generates an acid upon irradiation of an actinic ray or radiation can be selected from compounds ordinarily used as compounds (acid-generators) that are decomposed by irradiation of an actinic ray or radiation to generate an acid.

Specifically, the compound can be appropriately selected from photoinitiators for photo-cationic polymerization, photoinitiators for photo-radical polymerization, photo-achromatic agents for dyes, photo-discoloring agents, compounds capable of generating an acid with known light used for microresists (for example, an ultraviolet ray having a wavelength of from 400 to 200 nm or a far ultraviolet ray, particularly preferably g-line, h-line, i-line or a KrF excimer laser beam), an ArF excimer laser beam, an $F_2$ excimer laser beam, an electron beam, an X ray, a molecular beam or an ion beam, and mixtures thereof.

Specific examples of such compounds include diazonium salts as described, e.g., in S. I. Schlesinger, *Photogr. Sci. Eng.*, 18, 387 (1974) and T. S. Bal et al., *Polymer*, 21, 423 (1980); onium salts, for example, ammonium salts as described, e.g., in U.S. Pat. Nos. 4,069,055, 4,069,056 and Re 27,992 and JP-A-3-140140, phosphonium salts as described, e.g., in D. C. Necker et al., *Macromolecules*, 17, 2468 (1984), C. S. Wen et al., *Teh. Proc. Conf. Rad. Curing ASIA*, p. 478, Tokyo (October, 1988) and U.S. Pat. Nos. 4,069,055 and 4,069,056, iodonium salts as described, e.g., in J. V. Crivello et al., *Macromolecules*, 10(6), 1307(1977), *Chem. & Eng. News*, Nov. 28, p. 31 (1988), European Patents 104,143, 339,049 and 410,201, JP-A-2-150848 and JP-A-2-296514, sulfonium salts as described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,883,827, German Patents 2,904, 626, 3,604,580 and 3,604,581, selenonium salts as described, e.g., in J. V. Crivello et al., *Macromolecules*, 10(6), 1307 (1977) and J. V. Crivello et al., *J. Polymer Sci.*, Polymer Chem. Ed., 17, 1047 (1979), and arsonium salts as described, e.g., in C. S. Wen et al., *Teh. Proc. Conf. Rad. Curing ASIA*, p. 478, Tokyo (October, 1988); organic halogen compounds as described, e.g., in U.S. Pat. No. 3,905, 815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metal/organic halogen compounds as described, e.g., in K. Meier et al., *J. Rad. Curing*, 13(4), 26(1986), T. P. Gill et al., *Inorg. Chem.*, 19, 3007 (1980), D. Astruc, *Acc. Chem. Res.*, 19(12), 377 (1986) and JP-A-2-161445; photo-acid generators having an o-nitrobenzyl type protective group as described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc., Perkin I*, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patents 290,750, 046,083, 156,535, 271,851 and 388,343, U.S. Pat. Nos. 3,901,710 and 4,181,531, JP-A-60-198538 and JP-A-53-133022; compounds generating a sulfonic acid upon photolysis, as typified by iminosulfonates, as described, e.g., in M. Tunooka et al., *Polymer Preprints Japan*, 35(8), G. Berner et al., *J. Rad. Curing*, 13(4), W. J. Mijs et al., *Coating Technol.*, 55(697), 45(1983), Akzo, H. Adachi et al., *Polymer Preprints Japan*, 37(3), European Patents 199,672, 084,515, 044,115, 618,564 and 101,122, U.S. Pat. Nos. 4,371,605 and 4,431,774, JP-A-64-18143, JP-A-2-245756 and JP-A-3-140109; and disulfone compounds as described, e.g., in JP-A-61-166544.

Of the compounds that generate an acid upon irradiation of an actinic ray or radiation, a compound (A1) that generates an organic sulfonic acid upon irradiation of an actinic ray or radiation is preferably used in the invention.

The compound (A1) that generates an organic sulfonic acid upon irradiation of an actinic ray or radiation includes a compound (A1a) that generates a sulfonic acid containing a fluorine atom upon irradiation of an actinic ray or radiation and a compound (A1b) that generates a sulfonic acid free from a fluorine atom upon irradiation of an actinic ray or radiation.

(A1a) Compound that generates a sulfonic acid containing a fluorine atom upon irradiation of an actinic ray or radiation The compound that generates a sulfonic acid containing a fluorine atom upon irradiation of an actinic ray or radiation includes, for example, an iodonium salt represented by formula (PAG3) shown below and a sulfonium salt represented by formula (PAG4) shown below.

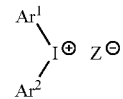
(PAG3)

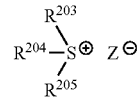
(PAG4)

In the above formulae, $Ar^1$ and $Ar^2$ each independently represent an aryl group. $R^{203}$, $R^{204}$ and $R^{205}$ each independently represent an alkyl group or an aryl group.

$Z^-$ represents an anion of sulfonic acid having at least one fluorine atom.

Alternatively, two of $R^{203}$, $R^{204}$ and $R^{205}$, or $Ar^1$ and $Ar^2$ may be combined with each other through a single bond or a substituent.

The aryl group represented by $Ar^1$, $Ar^2$, $R^{203}$, $R^{204}$ or $R^{205}$ is preferably an aryl group having from 6 to 14 carbon atoms. The alkyl group represented by $Ar^1$, $Ar^2$, $R^{203}$, $R^{204}$ or $R^{205}$ is preferably an alkyl group having from 1 to 8 carbon atoms.

Preferred examples of the substituent for the aryl group include an alkoxy group having from 1 to 8 carbon atoms, an alkyl group having from 1 to 8 carbon atoms, an alkoxycarbonyl group having from 2 to 9 carbon atoms, an alkylcarbonylamino group having from 2 to 9 carbon atoms, a nitro group, a carboxy group, a hydroxy group, a halogen atom and a phenylthio group. Preferred examples of the substituent for the alkyl group include an alkoxy group having from 1 to 8 carbon atoms, an aryl group having from 6 to 14 carbon atoms, an arylcarbonyl group having from 7 to 15 carbon atoms, a carboxy group and a halogen atom.

The anion of sulfonic acid represented by $Z^-$ includes preferably an anion of sulfonic acid containing an aliphatic hydrocarbon group having from 1 to 20 carbon atoms or an aromatic hydrocarbon group having from 6 to 20 carbon atoms and at least one fluorine atom. The hydrocarbon group may have a substituent. Examples of the substituent include an alkoxy group having from 1 to 10 carbon atoms, which may be substituted with a fluorine atom, an alkoxycarbonyl group having from 2 to 11 carbon atoms, which may be substituted with a fluorine atom, a phenylamino group, a phenylcarbonyl group, a halogen atom and a hydroxy group. The substituent for the aromatic hydrocarbon group further includes an alkyl group having from 1 to 15 carbon atoms.

Of the aliphatic sulfonic acid anions, an anion having a fluorine atom on the α-carbon atom of sulfonic acid has a high acid strength. The perfluoro aliphatic sulfonic acid anion has a higher acid strength.

Specific examples of such compounds are set forth below, but the invention should not be construed as being limited thereto.

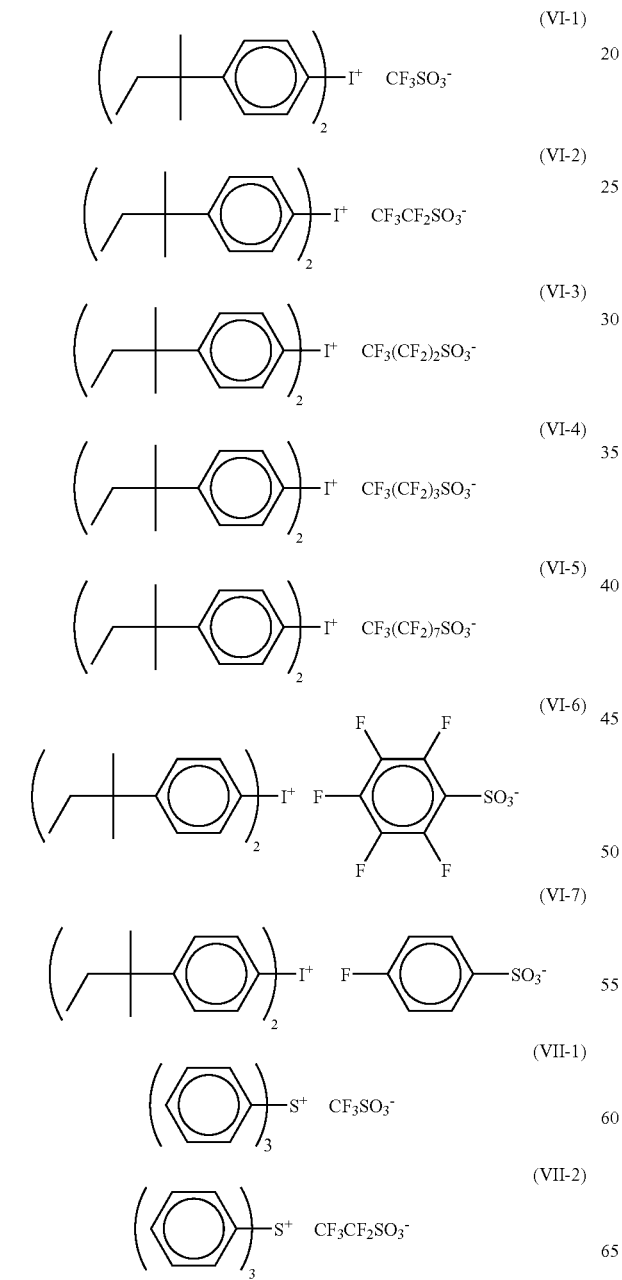

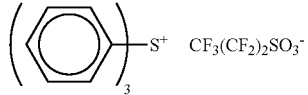

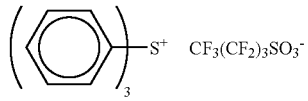

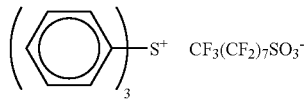

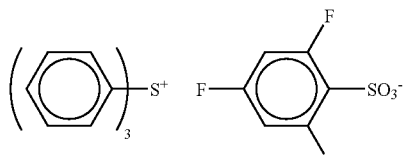

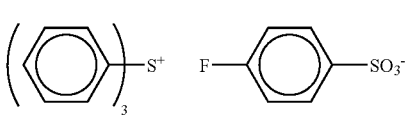

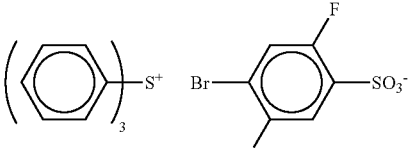

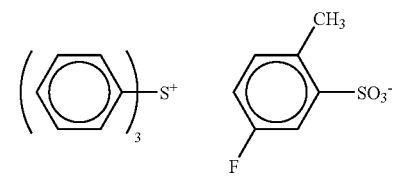

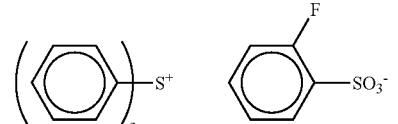

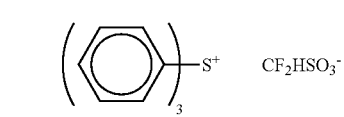

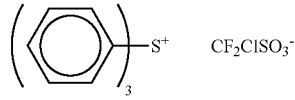

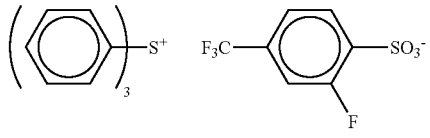

-continued
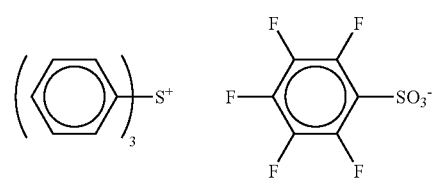 (VII-14)
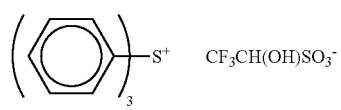 (VII-15)
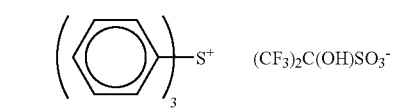 (VII-16)
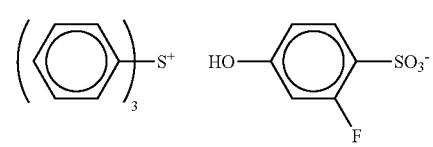 (VII-17)
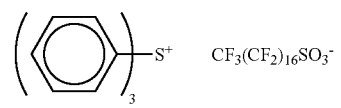 (VII-18)
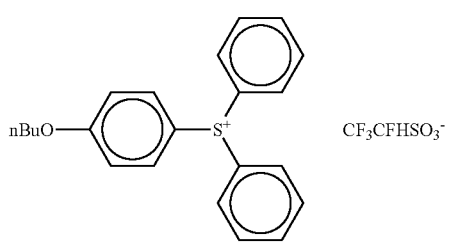 (VII-19)
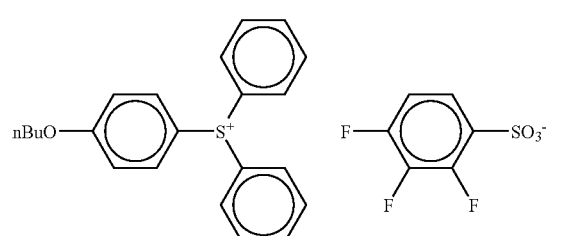 (VII-20)
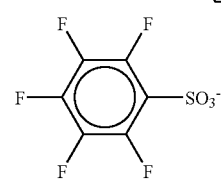 (VII-21)
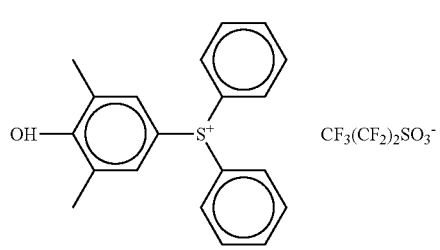 (VII-21 cont.)
-continued
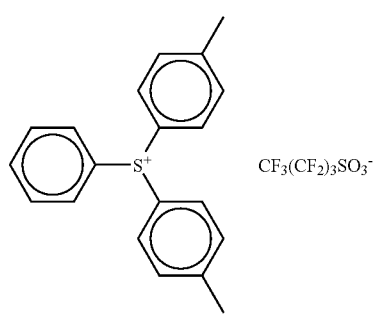 (VII-22)
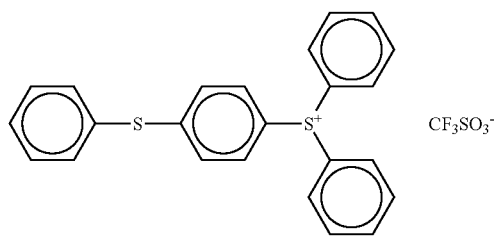 (VII-23)
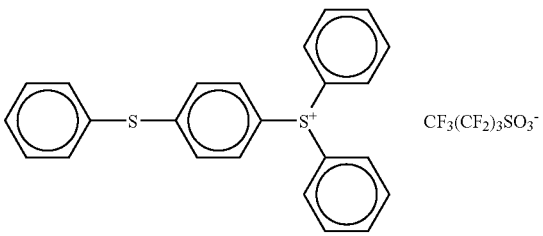 (VII-24)
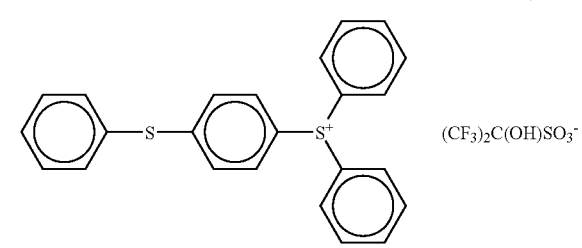 (VII-25)
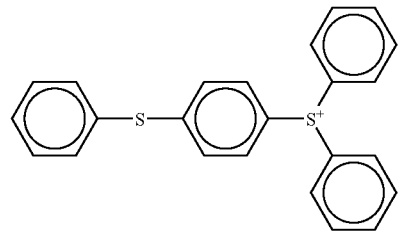 (VII-26)

-continued
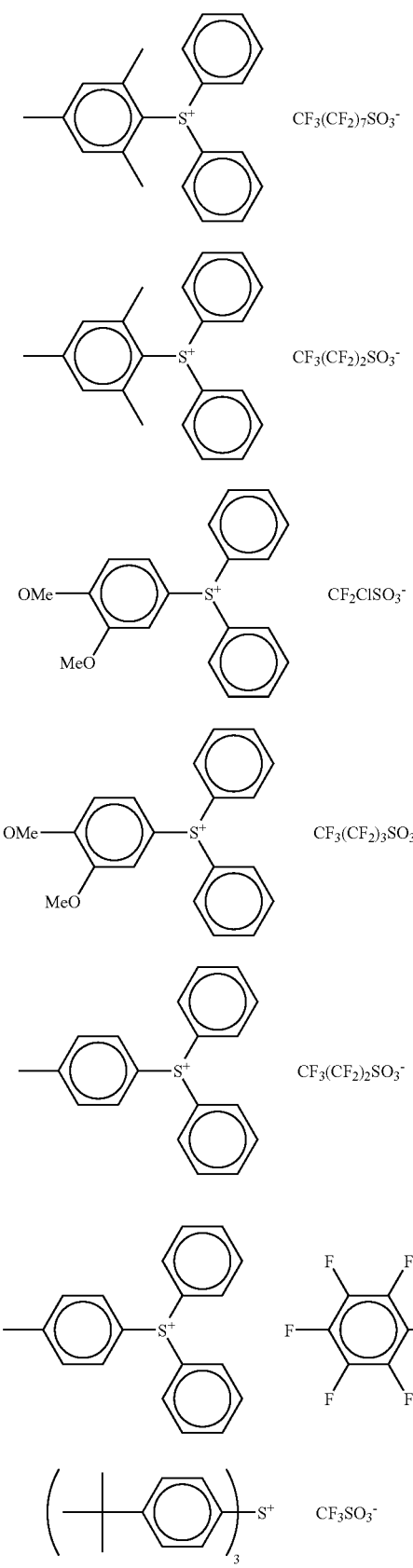
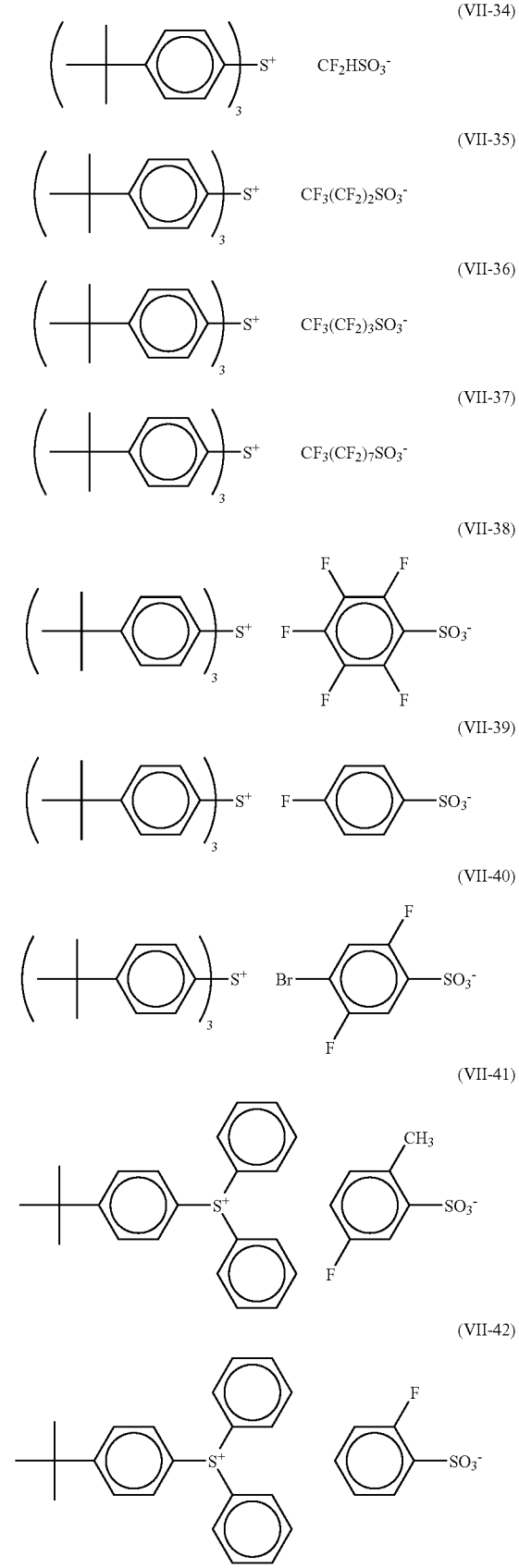

-continued (VII-43)
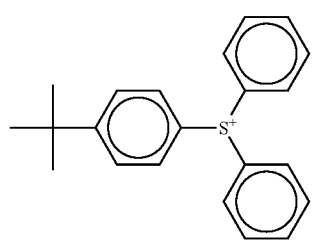 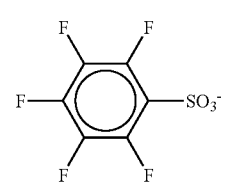

(VII-44)
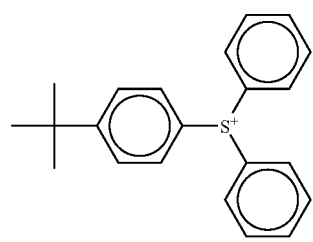 CF$_2$ClSO$_3^-$ (VII-45)
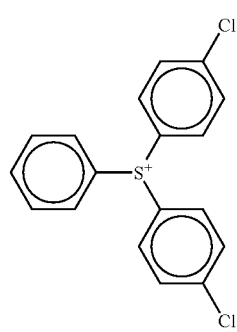 CF$_3$(CF$_2$)$_3$SO$_3^-$ (VII-46)
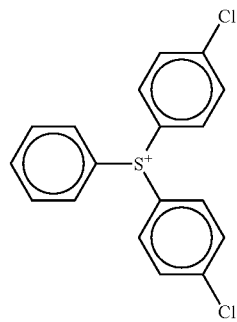 CF$_3$(CF$_2$)$_7$SO$_3^-$ (VII-47)
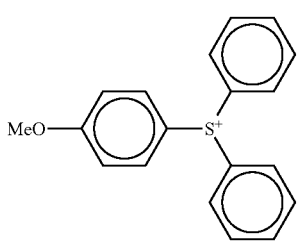 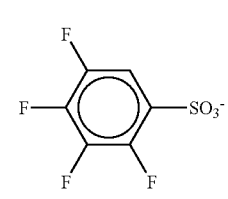

-continued (VII-48)
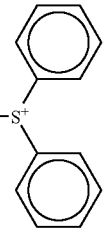 CF$_3$(CF$_2$)$_2$SO$_3^-$ (VII-49)
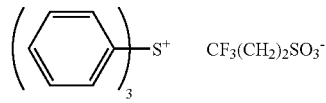 CF$_3$(CH$_2$)$_2$SO$_3^-$ (VII-50)
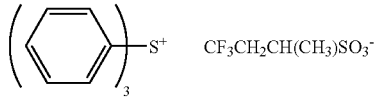 CF$_3$CH$_2$CH(CH$_3$)SO$_3^-$ (VII-51)
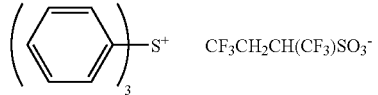 CF$_3$CH$_2$CH(CF$_3$)SO$_3^-$ (VII-52)
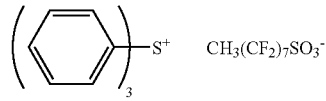 CH$_3$(CF$_2$)$_7$SO$_3^-$ (VII-53)
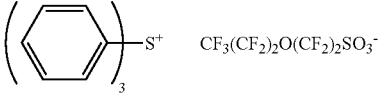 CF$_3$(CF$_2$)$_2$O(CF$_2$)$_2$SO$_3^-$ (VII-54)
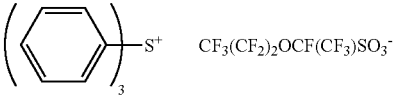 CF$_3$(CF$_2$)$_2$OCF(CF$_3$)SO$_3^-$ (VII-55)
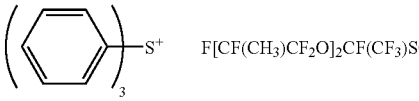 F[CF(CH$_3$)CF$_2$O]$_2$CF(CF$_3$)SO$_3^-$ (VII-56)
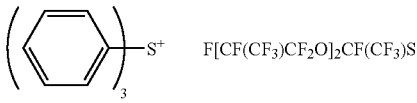 F[CF(CF$_3$)CF$_2$O]$_2$CF(CF$_3$)SO$_3^-$ (A1b) Compound that Generates a Sulfonic Acid Free from a Fluorine Atom Upon Irradiation of an Actinic Ray or Radiation.

The compound that generates a sulfonic acid free from a fluorine atom upon irradiation of an actinic ray includes, for example, an iodonium salt represented by formula (PAG3) shown above and a sulfonium salt represented by formula (PAG4) shown above, wherein Z$^-$ represents an anion of sulfonic acid having no fluorine atom.

Specific examples of such compounds are set forth below, but the invention should not be construed as being limited thereto.

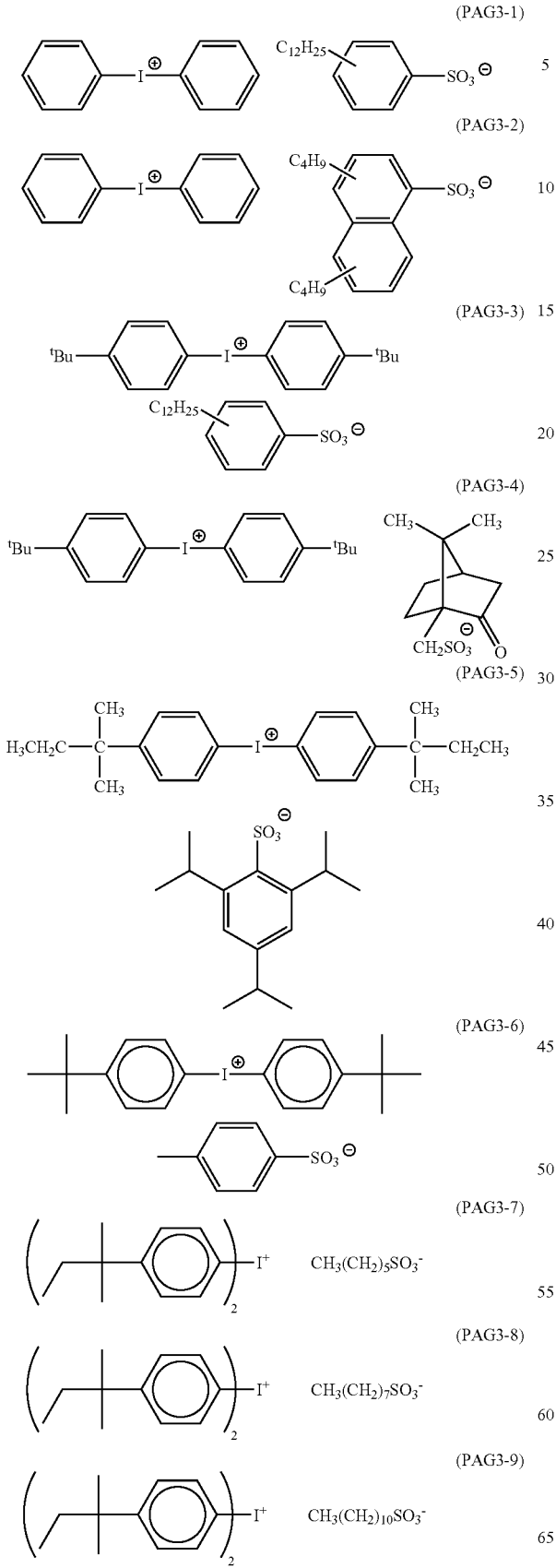
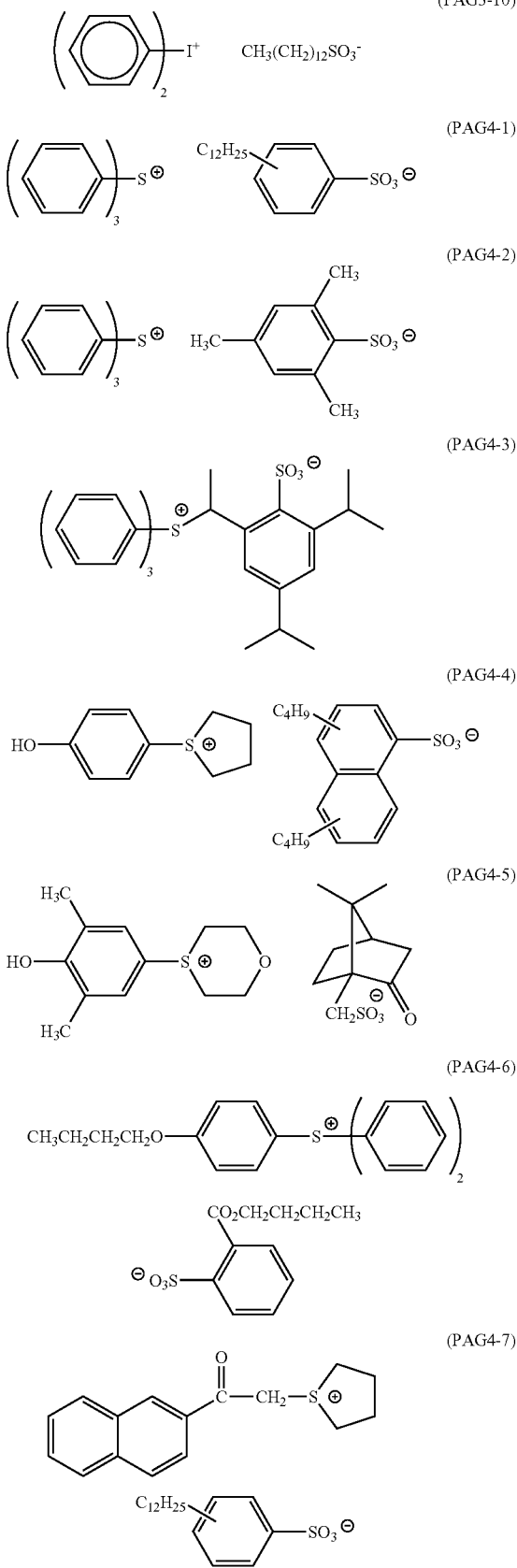

-continued (PAG4-8), (PAG4-9), (PAG4-10), (PAG4-11), (PAG4-12), (PAG4-13), (PAG4-14), (PAG4-15), (PAG4-16)

Further, a disulfone derivative represented by formula (PAG5) shown below and an iminosulfonate derivative represented by formula (PAG6) shown below are exemplified.

$$Ar^3—SO_2—SO_2—Ar^4 \quad \text{(PAG5)}$$

(PAG6)

$$R^{206}—SO_2—O—N{\overset{\displaystyle O}{\underset{\displaystyle O}{\bigg\langle}}}A$$

In formulae (PAG5) and (PAG6), $Ar^3$ and $Ar^4$ each independently represent an aryl group. $R^{206}$ represents an alkyl group or an aryl group. A represents an alkylene group, an alkenylene group or an arylene group.

Specific examples of such compounds are set forth below, but the invention should not be construed as being limited thereto.

(PAG5-1), (PAG5-2), (PAG5-3), (PAG5-4), (PAG5-5), (PAG6-1)

(PAG6-2)
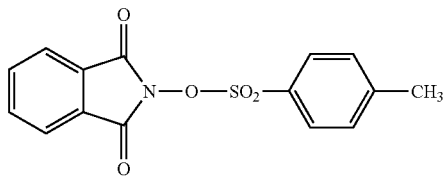

(PAG6-3)
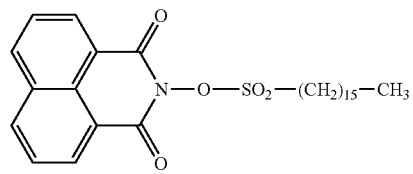

(PAG6-4)
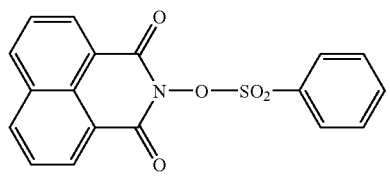

(PAG6-5)
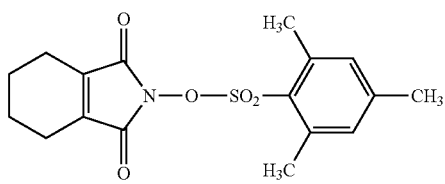

(PAG6-6)
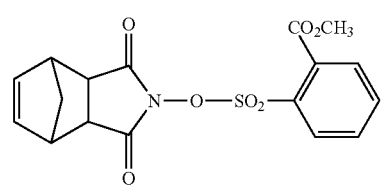

Moreover, a diazodisulfone derivative represented by formula (PAG7) shown below is also exemplified.

(PAG7)
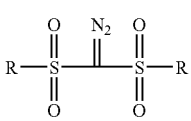

In formula (PAG7), R represents an alkyl group, a cycloalkyl group or an aryl group.

Specific examples of such compounds are set forth below, but the invention should not be construed as being limited thereto.

(PAG7-1)
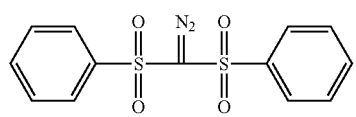

(PAG7-2)
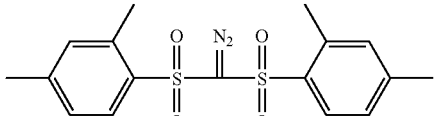

(PAG7-3)
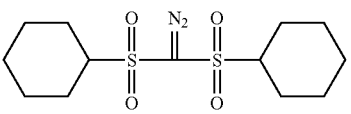

(PAG7-4)
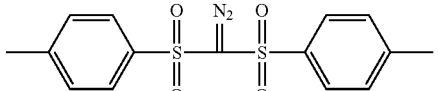

(PAG7-5)
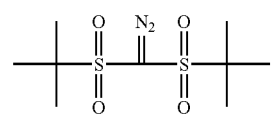

The compound of any one of formulae (A1a) and (A1b) can be synthesized by reacting an aromatic compound with a periodate and subjecting the resulting iodonium salt to salt exchange with a corresponding sulfonic acid.

The compound can also be synthesized, for example, by a method comprising reacting an aryl Grignard reagent, e.g., an aryl magnesium bromide with a substituted or unsubstituted phenylsulfoxide and then subjecting the resulting triaryl sulfonium halide to salt exchange with a corresponding sulfonic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange, or a method comprising condensing a diaryl iodonium salt with a diaryl sulfide in the presence of a catalyst, e.g., copper acetate and then subjecting the resulting condensate to salt exchange.

The salt exchange can be conducted by introducing once into a halide, followed by converting to a sulfonate using a silver reagent, e.g., silver oxide, or by using an ion exchange resin. For the salt exchange, a sulfonic acid or sulfate commercially available or a sulfonic acid or sulfate obtained by hydrolysis of a commercially available sulfonic acid halide can be employed.

The amount of the compound of Component (A) added is ordinarily from 0.5 to 20% by weight, preferably from 0.75 to 15% by weight, and more preferably from 1 to 10% by weight, based on the total solid content of the positive resist composition.

[3] Organic Basic Compound

It is preferred that the positive resist composition of the invention contains an organic basic compound for the purpose of preventing fluctuations in performances (for example, formation of T-top shaped pattern, fluctuation in sensitivity or fluctuation in linewidth of pattern) with the lapse of tire between the irradiation of an actinic ray or radiation and a heat treatment, fluctuations in performances with the lapse of time after coating, or excessive diffusion of the acid at the heat treatment after the irradiation of an actinic ray or radiation, which results in deterioration of the resolution. AS the organic basic compound, for example, an organic basic compound containing a basic nitrogen atom is exemplified, and a compound exhibiting pKa of a conjugated acid of not less than 4 is preferably used.

Specifically, compounds having a structure represented by any one of formulae (A) to (E) shown below are used.

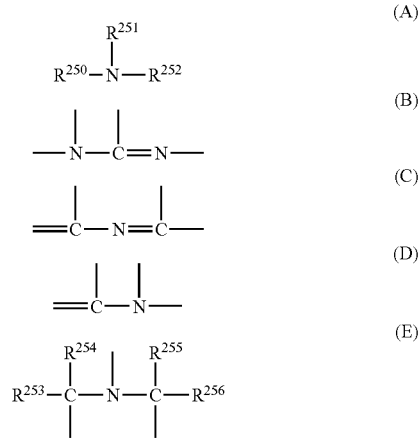

In the above formulae, $R^{250}$, $R^{251}$ and $R^{252}$, which may be the same or different, each represent a hydrogen atom, an alkyl group having from 1 to 20 carbon atoms, a cycloalkyl group having from 3 to 20 carbon atoms or an aryl group having from 6 to 20 carbon atoms, or $R^{251}$ and $R^{252}$ may be connected with each other to form a ring.

The alkyl group, cycloalkyl group and aryl group represented by any one of $R^{250}$, $R^{251}$ and $R^{252}$ may have a substituent. The alkyl group or cycloalkyl group, which may have a substituent, include, for example, an aminoalkyl group having from 1 to 20 carbon atoms, an aminocycloalkyl group having from 3 to 20 carbon atoms, a hydroxyalkyl group having from 1 to 20 carbon atoms and a hydroxycycloalkyl group having from 3 to 20 carbon atoms.

$R^{253}$, $R^{254}$, $R^{255}$ and $R^{256}$, which may be the same or different, each represent an alkyl group having from 1 to 20 carbon atoms or a cycloalkyl group having from 3 to 20 carbon atoms.

More preferred compounds are nitrogen-containing basic compounds having two or more nitrogen atoms having different chemical circumstances per molecule, and particularly preferred compounds are compounds having both a substituted or unsubstituted amino group and a cyclic structure containing a nitrogen atom and compounds having an alkylamino group.

Preferred examples of the organic basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the organic basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, the organic basic compound for use in the invention should not be construed as being limited to these compounds.

The organic basic compounds may be used individually or as a mixture of two or more thereof.

A ratio of the acid generator to the organic basic compound (acid generator)/(organic basic compound) used in the positive resist composition is preferably from 2.5 to 300 in a molar ratio. The molar ratio of (acid generator)/(organic basic compound) is preferably from 5.0 to 200, and more preferably from 7.0 to 150.

[4] Surfactant

It is preferred that the positive resist composition of the invention contains a surfactant, particularly, a fluorine-based and/or silicon-based surfactant. Specifically, the positive resist composition of the invention preferably contains one or more of a fluorine atom-containing surfactant, a silicon atom-containing surfactant and a surfactant containing both a fluorine atom and a silicon atom. The addition of such a fluorine-based and/or silicon-based surfactant is effective for the suppression of development defect and the improvement in coating property.

Examples of the fluorine-based and/or silicon-based surfactant include those as-described in JP-A-62-36663, JP-A-61-226146, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,296,143, 5,294,511 and 5,824,451. Commercially available surfactants described below may also be used as they are.

Examples of the commercially available fluorine-based and/or silicon-based surfactant, which can be used, include fluorine-based surfactants or silicon-based surfactants, e.g., Eftop EF301 and EF303 (manufactured by Shin-Akita Kasei Co., Ltd.), Florad FC430 and 431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as the silicon-based surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the fluorine-based and/or silicon-based surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene)) acrylate and/or (poly(oxyalkylene)) methacrylate is preferred. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block connecting group) or poly(oxyethylene-oxypropylene block connecting group) may be used. Further, the copolymer of a monomer having a fluoroaliphatic group with a (poly(oxyalkylene)) acrylate (or methacrylate) may be not only a binary copolymer but also a ternary or more component-containing copolymer obtained by copolymerizing simultaneously two or more different monomers having a fluoroaliphatic group with two or more different (poly(oxyalkylene)) acrylates (or methacrylates).

Examples of the commercially available polymer fluorine-based and/or silicon-based surfactants include Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate) and (poly(oxypropylene)) acrylate (or methacrylate), copolymers of acrylate (or methacrylate) having a $C_8F_{17}$ group and (poly(oxyalkylene)) acrylate (or methacrylate), copolymers of acrylate (or methacrylate) having a $C_8F_{17}$ group, (poly(oxyethylene)) acrylate (or methacrylate) and (poly(oxypropylene)) acrylate (or methacrylate) are exemplified.

The amount of the fluorine-based and/or silicon-based surfactant used is preferably from 0.0001 to 2% by weight, more preferably from 0.001 to 1% by weight, and particularly preferably from 0.01 to 1% by weight, based on the total amount of the positive resist composition (excluding a solvent).

[5] Solvent

The positive resist composition of the invention is used by dissolving the above-described components in a solvent that can dissolve the components, and coating the resulting solution on a substrate. Preferred examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether., 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran. The solvents may be used individually or as a mixture of two or more thereof.

In the invention, it is preferred to use a mixed solvent in which a propylene glycol monoalkyl ether acetate, for example, propylene glycol monomethyl ether acetate is mixed with a propylene glycol monoalkyl ether, for example, propylene glycol monomethyl ether or propylene glycol monoethyl ether or an alkyl lactate, for example, ethyl lactate.

A solid content concentration when the above-described components are dissolved in a solvent is preferably from 3 to 15% by weight, and more preferably from 5 to 10% by weight.

The steps of pattern formation on a resist film, for example, in the production of precise integrated circuit devices, comprises applying the positive resist composition of the invention to a substrate (for example, silicon/silicon dioxide coating, a transparent substrate, e.g., glass substrate or ITO substrate), irradiating the resist film using an actinic ray or radiation drawing apparatus, followed by heating, developing, rinsing and drying. Thus, good resist patterns are obtained.

The developing solution, which can be used for the positive resist composition of the invention, is an aqueous solution of alkali, for example, an inorganic alkali, e.g., sodium hydroxide, potassium hydroxide, sodium carbonate, sodium silicate, sodium metasilicate or aqueous ammonia; a primary amine, e.g., ethylamine or n-propylamine; a secondary amine, e.g., diethylamine or di-n-butylamine; a tertiary amine, e.g., triethylamine or methyldiethylamine; an alcohol amine, e.g., dimethylethanolamine or triethanolamine; a quaternary ammonium salt, e.g., tetramethylammonium hydroxide, tetraethylammonium hydroxide or choline; and a cyclic amine, e.g., pyrrole or piperidine. A developing solution prepared by adding an appropriate amount of an alcohol, for example, isopropyl alcohol or a surfactant, for example, a nonionic surfactant, to the above-described aqueous solution of alkali is also used.

Of the developing solutions, those containing a quaternary ammonium salt are preferred and, those containing tetramethylammonium hydroxide or choline are more preferred.

The alkali concentration of the alkali developing solution is ordinarily from 0.1 to 20% by weight, preferably from 0.2 to 15% by weight, and more preferably from 0.5 to 10% by weight.

The pH of the alkali developing solution is ordinarily from 10.0 to 15.0, preferably from 10.5 to 14.5, and more preferably from 11.0 to 14.0.

The present invention will be described in more detail with reference to the following examples, but the invention should not be construed as being limited thereto.

SYNTHESIS EXAMPLE 1

Synthesis of Monomer Having Acid-decomposable Group

In tetrahydrofuran was dissolved 27.5 g of 3-(5-bicyclo[2.2.1]hepten-2-yl)-1,1,1-trifluoro-2-(trifluoromethyl)-2-propan-2-ol and the resulting solution was cooled to 0° C. under nitrogen atmosphere. To the solution was added 4.6 g of sodium hydride (60%) over a period of 30 minutes and then was dropwise added 20.4 g of chloromethyl methyl ether, followed by stirring for 30 minutes as it was. The temperature of the reaction solution was raised to room temperature, and then 300 ml of ethyl acetate was added thereto. The reaction solution was washed three times with each 500 ml of distilled water. The ethyl acetate layer separated was treated in an evaporator to distill off the ethyl acetate to obtain 28.9 g of Monomer (M1) shown below.

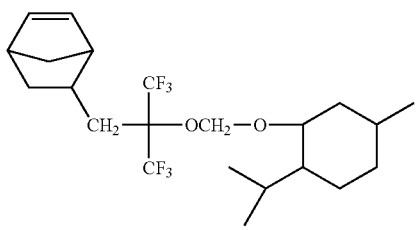

(M1)

SYNTHESIS EXAMPLE 2

Synthesis of Resin (F-1)

In 100 ml of tetrahydrofuran were dissolved 13.3 g of acid-decomposable Monomer (M1) described above, 6.0 g of α-trifluoromethylacrylic acid 2-ethyladamantyl ester and 9.2 g of α-trifluoromethylacrylic acid dihydroxyadamantyl ester and the solution was introduced into an autoclave under nitrogen atmosphere. 1.24 g of an azo series polymerization initiator (V-65, manufactured by Wako Pure Chemical Industries, Ltd.) was added and then 2.0 g of tetrafluoroethylene was charged, followed by reacting at 70° C. for 10 hours with stirring.

To the reaction solution was added 500 ml of hexane to precipitate a polymer and the supernatant liquid was removed by decantation. The remaining viscous polymer was dissolved in 50 ml of acetone and one liter of hexane was again added thereto to conduct separation treatment of the polymer, thereby removing the unreacted monomers and oligomer components. The polymer obtained was subjected to measurement of molecular weight by gel permeation chromatography (GPC) and it was found that the weight average molecular weight and degree of dispersion were 10,200 and 1.9, respectively.

The polymer was again dissolved in 50 ml of acetone and one liter of hexane was again added thereto to conduct separation treatment of Polymer (F-1), thereby removing the unreacted monomers and oligomer components. Polymer (F-1) obtained was subjected to measurement of molecular weight by gel permeation chromatography (GPC) and it was found that the weight average molecular weight and degree of dispersion were 8,000 and 1.4, respectively.

In the same manner as described above, the resins shown in Table 1 below were obtained.

TABLE 1

| Resin | Monomer Composition (molar ratio) | Weight Average Molecular Weight | Degree of Dispersion |
|---|---|---|---|
| (F-1) | 30/20/20/30 | 8,000 | 1.4 |
| (F-2) | 15/25/40/20 | 8,000 | 1.45 |
| (F-3) | 25/25/30/20 | 7,000 | 1.5 |
| (F-4) | 20/30/20/30 | 6,000 | 1.45 |
| (F-6) | 10/30/30/30 | 9,000 | 1.5 |
| (F-8) | 30/20/20/30 | 10,000 | 1.4 |
| (F-10) | 20/30/20/30 | 10,000 | 1.5 |
| (F-12) | 25/25/30/20 | 7,000 | 1.45. |

SYNTHESIS OF RESIN (CP) FOR COMPARATIVE EXAMPLE

Resin (CP) for comparative example having the structure shown below was synthesized in the same manner as in Synthesis Example 2 except for using as the monomers, 6.9 g of 3-(5-bicyclo[2.2.1]hepten-2-yl)-1,1,1-trifluoro-2-(trifluoromethyl)-2-propan-2-ol, 8.0 g of monomer in which the hydroxy group of 3-(5-bicyclo[2.2.1]hepten-2-yl)-1,1,1-trifluoro-2-(trifluoromethyl)-2-propan-2-ol was protected with a methoxymethyl group and 5.1 g of tetrafluoroethylene. The weight average molecular weight and degree of dispersion of Resin (CP) were 8,000 and 1.4, respectively:

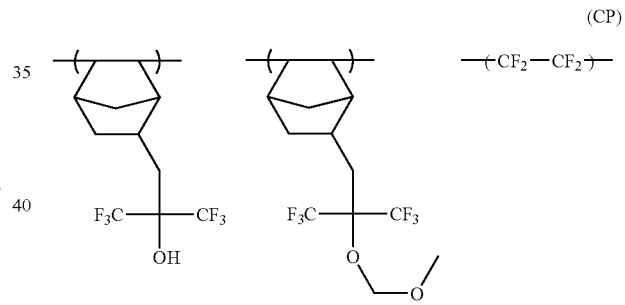

(CP)

EXAMPLES 1 TO 8 AND COMPARATIVE EXAMPLE 1

A resin solution prepared by dissolving 1.2 g of resin, 0.030 g of acid generator, 100 ppm of surfactant to the polymer solution and 0.0012 g of organic basic compound in 19.6 g of solvent as shown in Table 2 below was filtered through a polytetrafluoroethylene filter having a pore size of 0.1 μm to prepare a positive resist solution.

TABLE 2

| | Resin | Acid Generator | Solvent (weight ratio) | Organic Basic Compound | Surfactant | Surface Roughness | Development Defect | Scum |
|---|---|---|---|---|---|---|---|---|
| Example 1 | (F-1) | (VII-4) | S-2 | N-1 | W-1 | A | 25 | A |
| Example 2 | (F-2) | (VII-4) | S-2 | N-1 | W-1 | A | 30 | A |
| Example 3 | (F-3) | (VII-24) | S-2/S-1 (80/20) | N-2 | W-2 | A | 38 | A |
| Example 4 | (F-4) | (VII-36) | S-2 | N-1 | W-1 | B | 32 | B |
| Example 5 | (F-6) | (VII-53) | S-2 | N-3 | W-1 | A | 42 | A |

TABLE 2-continued

| | Resin | Acid Generator | Solvent (weight ratio) | Organic Basic Compound | Surfactant | Surface Roughness | Development Defect | Scum |
|---|---|---|---|---|---|---|---|---|
| Example 6 | (F-8) | (VII-36) | S-2/S-3 (80/20) | N-1 | W-2 | A | 28 | A |
| Example 7 | (F-10) | (VII-36) | S-2 | N-2 | W-1 | B | 39 | B |
| Example 8 | (F-12) | (VII-4) | S-2 | N-1 | W-1 | A | 39 | A |
| Comparative Example 1 | Comparative Resin (CP) | (VII-4) | S-2 | N-1 | W-1 | C | 78 | C |

The abbreviations shown in Table 2 indicate the following compounds.

N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (manufactured by Dainippon Ink and Chemicals, Inc.) (fluorine-based)
W-2: Megafac R08 (manufactured by Dainippon Ink and Chemicals, Inc.) (fluorine- and silicon-based)
S-1: Methyl lactate
S-2: Propylene glycol monomethyl ether acetate
S-3: Propylene glycol monomethyl ether On a silicon wafer having coated thereon an anti-reflective coating (DUV42-6, manufactured by Brewer Science, Inc.), the positive resist solution described above was uniformly coated by a spin coater and dried by heating at 120° C. for 60 seconds to form a positive resist film having a thickness of 0.12 μm. The resist film was subjected to pattern exposure using an ArF microstepper and immediately after the exposure, it was heated at 110° C. for 90 seconds on a hot plate. Then, the resist film was developed with a 2.38% by weight aqueous solution of tetramethylammonium hydroxide at 23° C. for 30 seconds, rinsed with pure water for 30 seconds and dried. With the pattern on the silicon wafer thus-obtained, surface roughness, development defect and development residue (scum) were evaluated in the manner shown below.

[Surface Roughness]

In a line and space pattern of 0.11 μm, a degree of roughness on the line surface portion was visually evaluated according to observation by SEM. A case wherein roughness (convexoconcave) was hardly observed on the line surface was rated as A, a case wherein roughness was somewhat observed on the line surface was rated as B, and a case wherein roughness was apparently observed on the line surface was rated as C.

[Evaluation Test of Development Defect]

With the resist pattern obtained as above, a number of development defect was measured by an apparatus (KLA-2112, manufactured by KLA Tencor Corp.). The primary datum value was designated as the result of measurement.

[Occurrence of Scum]

A degree of development residue (scum) on the resist pattern having a linewidth of 0.15 μm was evaluated. A case wherein the residue was not observed was ranked as A, a case wherein the residue was considerably observed was ranked as C, and intermediate between A and C was rated as B.

The results of performance evaluation are shown in Table 2.

Form the results shown in Table 2, it is apparent that the positive resist composition of the invention is excellent in the surface roughness, development defect and scum.

[Resolution]

On a silicon wafer having coated thereon an anti-reflective coating (DUV42-6, manufactured by Brewer Science, Inc.), each of the positive resist solutions of Examples 1, 3 and 6 and Comparative Example 1 was uniformly coated by a spin coater and dried by heating at 120° C. for 60 seconds to form a positive resist film having a thickness of 0.12 μm. The resist film was subjected to pattern exposure using an F2 microstepper and immediately after the exposure, it was heated at 110° C. for 90 seconds on a hot plate. Then, the resist film was developed with a 2.38% by weight aqueous solution of tetramethylammonium hydroxide at 23° C. for 30 seconds, rinsed with pure water for 30 seconds and dried. With the pattern on the silicon wafer thus-obtained, resolution performance was evaluated using a limiting resolution capable of being reproduced in the minimum exposure amount necessary for reproducing line and space of 100 nm.

The results of evaluation are shown in Table 3.

TABLE 3

| | Resolution (nm) |
|---|---|
| Example 1 | 70 |
| Example 3 | 80 |
| Example 6 | 75 |
| Comparative Example 1 | 100 |

Form the results shown in Table 3, it can be seen that the positive resist composition of the invention exhibit high resolution.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A) a compound that generates an acid upon irradiation of an actinic ray or radiation and (B) a resin having a property of increasing solubility in an alkali developing solution by the action of an acid and including a repeating unit containing a partial structure represented by formula (X) shown below and a repeating unit represented by formula (Y) shown below:

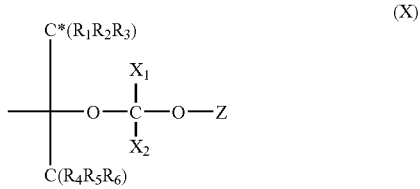

(X)

wherein $R_1$ to $R_6$ each independently represents a hydrogen atom, a fluorine atom or a fluoroalkyl group, provided that at least one of $R_1$ to $R_6$ is not a hydrogen atom, $X_1$ and $X_2$ each represents a hydrogen atom, and Z represents a monovalent organic group having at least one cyclic hydrocarbon structure;

(Y)

wherein $R_a'$, $R_b'$, $R_c'$ and $R_d'$ each independently represents a hydrogen atom, a fluorine atom or a fluoroalkyl group, provided that at least one of $R_a'$ to $R_d'$ is not a hydrogen atom.

2. The positive resist composition as claimed in claim 1, wherein the resin of component (B) further includes a repeating unit containing an alicyclic structure having a hydroxy group or a hydroxyalkyl group.

3. The positive resist composition as claimed in claim 2, wherein the repeating unit containing an alicyclic structure having a hydroxy group or a hydroxyalkyl group is a repeating unit represented by the following formulae (II) or (III):

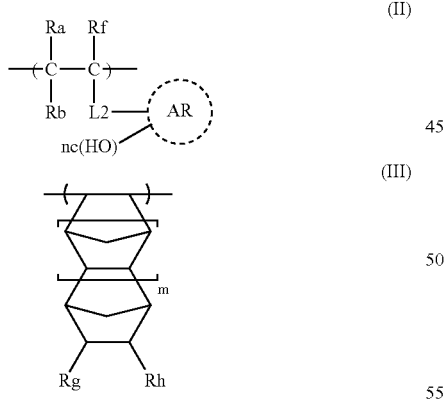

(II)

(III)

wherein $R_a$ and $R_b$ each independently represents a hydrogen atom, a fluorine atom, a methyl group or a fluoroalkyl group, Rf represents a hydrogen atom, a fluorine atom, a methyl group or a trifluoromethyl group, L2 represents a —C(=O)—O— group or a —O— group, AR represents an alicyclic hydrocarbon structure, Rg and Rh each independently represents a hydrogen atom, a hydroxy group or a hydroxyalkyl group, provided that at least one of Rg and Rh is not a hydrogen atom, m represents 0 or 1, and nc represents an integer of from 1 to 5.

4. The positive resist composition as claimed in claim 1, wherein the organic group represented by Z in formula (X) includes an alicyclic hydrocarbon structure having at least one bridged structure.

5. The positive resist composition as claimed in claim 1, wherein the organic group represented by Z in formula (X) includes at least one of a fluorine atom and an alkyl group substituted with a fluorine atom.

6. The positive resist composition as claimed in claim 1, wherein the resin of component (B) further includes at least one repeating unit selected from repeating units represented by the following formulae (IV) to (VII):

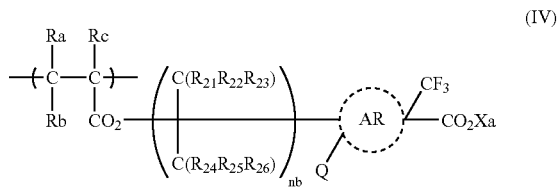

(IV)

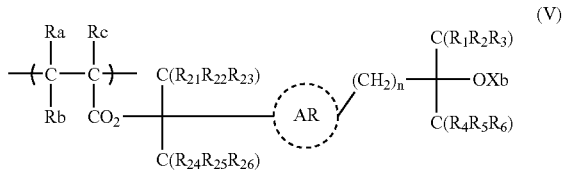

(V)

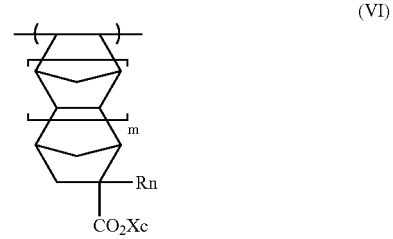

(VI)

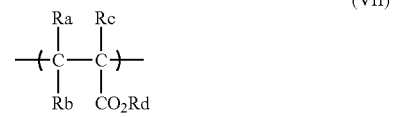

(VII)

wherein $R_a$, $R_b$ and $R_c$ each independently represents a hydrogen atom, a fluorine atom, a methyl group or a fluoroalkyl group, $R_{21}$ to $R_{26}$ each independently represents a hydrogen atom, a fluorine atom or a fluoroalkyl group, provided that at least one of $R_{21}$ to $R_{26}$ is not a hydrogen atom, AR represents an alicyclic hydrocarbon structure, Q represents a hydrogen atom or a hydroxy group, Xa represents a hydrogen atom or a group capable of being decomposed by the action of an acid, $R_1$ to $R_6$ each independently represents a hydrogen atom, a fluorine atom or a fluoroalkyl group, provided that at least one of $R_1$ to $R_6$ is not a hydrogen atom, Xb represents a hydrogen atom or a group capable of being decomposed by the action of an acid, Rn represents a fluorine atom or a trifluoromethyl group, Xc represents a hydrogen atom or a group capable of being decomposed by the action of an acid, Rd represents a hydrogen atom or a group capable of being decomposed by the action of an acid, nb represents 0 or 1, n represents 0 or 1, and m represents 0 or 1.

7. A pattern formation method comprising forming a resist film using the positive resist composition as claimed in claim 1, exposing the resist film, and developing the exposed resist film.

8. The positive resist composition as claimed in claim 1, wherein the organic group represented by Z in formula (X) includes a cyclic carbon structure together with a trifluoromethyl group.

9. The positive resist composition as claimed in claim 1, wherein $R_1$ to $R_6$ are fluorine atoms.

10. A positive resist composition comprising (A) a compound that generates an acid upon irradiation of an actinic ray or radiation and (B) a resin having a property of increasing solubility in an alkali developing solution by the action of an acid and including a repeating unit containing a partial structure represented by formula (IA), (IB) or (IC) shown below and a repeating unit represented by formula (Y) shown below:

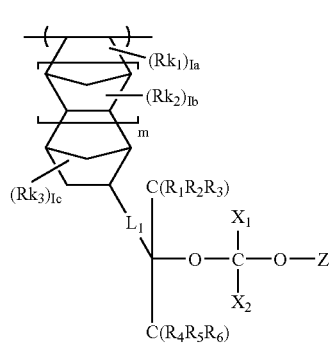
(IA)

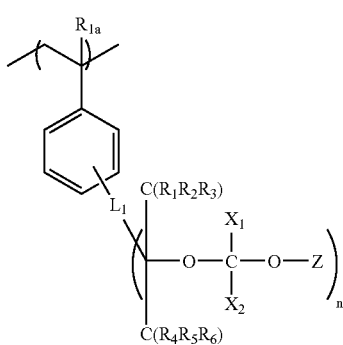
(IB)

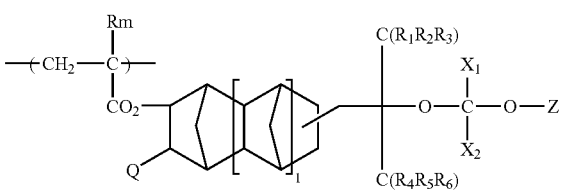
(IC)

wherein $R_1$ to $R_6$ each independently represents a hydrogen atom, a fluorine atom or a fluoroalkyl group, provided that at least one of $R_1$ to $R_6$ is not a hydrogen atom, or the carbon atom to which $R_3$ is connected may be connected to a main chain of the resin directly or through a connecting group, $X_1$ and $X_2$ each represents a hydrogen atom, Z represents a monovalent organic group having at least one cyclic hydrocarbon structure, $R_{k1}$, $R_{k2}$ to $R_{k3}$ each represents a halogen atom or an alkyl group, L1 represents a single bond or a divalent connecting group, $R_{1a}$ represents a hydrogen atom, a fluorine atom, a chlorine atom, a bromine atom, a cyano group or a trifluoromethyl group, Rm represents a hydrogen atom, a fluorine atom, a methyl group or a trifluoromethyl group, Q represents a hydrogen atom or a hydroxy group, m represents 0 or 1, 1a represents 0 or 1, 1b represents an integer of from 0 to 2, 1c represents an integer of from 0 to 5, n represents an integer of from 1 to 5, and 1 represents 0 or 1;

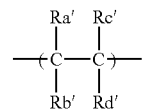
(Y)

wherein $R_a'$, $R_b'$, $R_c'$ and $R_d'$ each independently represents a hydrogen atom, a fluorine atom or a fluoroalkyl group, provided that at least one of $R_a'$ to $R_d'$ is not a hydrogen atom.

11. A positive resist composition comprising (A) a compound that generates an acid upon irradiation of an actinic ray or radiation and (B) a resin having a property of increasing solubility in an alkali developing solution by the action of an acid and including a repeating unit containing a partial structure represented by formula (IA) or (IC) shown below and a repeating unit represented by formula (Y) shown below:

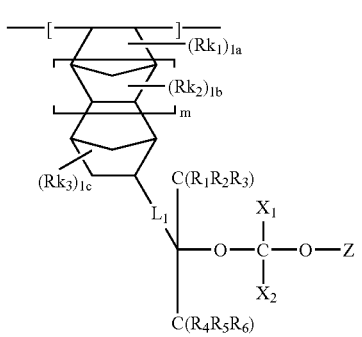
(IA)

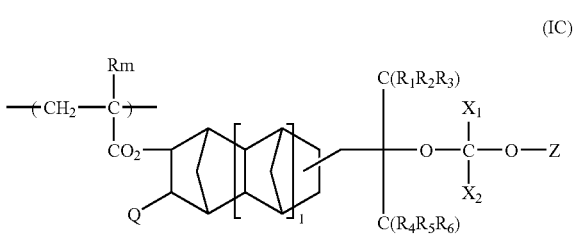
(IC)

wherein $R_1$ to $R_6$ each independently represents a hydrogen atom, a fluorine atom or a fluoroalkyl group, provided that at least one of $R_1$ to $R_6$ is not a hydrogen atom, or the carbon atom to which $R_3$ is connected may be connected to a main chain of the resin directly or through a connecting group, $X_1$ and $X_2$ each represents a hydrogen atom, Z represents a monovalent organic group having at least one cyclic hydrocarbon structure, $R_{k1}$, $R_{k2}$ and $R_{k3}$ each represents a halogen atom or an alkyl group, $L_1$ represents a single bond or a divalent connecting group, Rm represents a hydrogen atom, a fluorine atom, a methyl group or a trifluoromethyl group, Q represents a hydrogen atom or a hydroxyl group, m represents 0 or 1, 1a represents 0 or 1, 1b represents an integer of from 0 to 2, 1c represents an integer of from 0 to 5, and 1 represents 0 or 1;

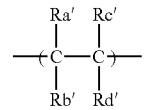

(Y)

wherein $R_a'$, $R_b'$, $R_c'$ and $R_d'$ each independently represents a hydrogen atom, a fluorine atom or a fluoroalkyl group, provided that at least one of $R_a'$ to $R_d'$ is not a hydrogen atom.

* * * * *